(12) United States Patent
Cho et al.

(10) Patent No.: US 12,073,909 B2
(45) Date of Patent: *Aug. 27, 2024

(54) PAGE BUFFER CIRCUIT AND MEMORY DEVICE INCLUDING THE SAME

(71) Applicant: Samsung Electronics Co., Ltd., Suwon-si (KR)

(72) Inventors: Yongsung Cho, Hwaseong-si (KR); Jinwoo Park, Hwaseong-si (KR); Hyunjun Yoon, Changwon-si (KR); Yoonhee Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

This patent is subject to a terminal disclaimer.

(21) Appl. No.: 18/085,963

(22) Filed: Dec. 21, 2022

(65) Prior Publication Data

US 2023/0131700 A1    Apr. 27, 2023

Related U.S. Application Data

(63) Continuation of application No. 17/222,024, filed on Apr. 5, 2021, now Pat. No. 11,568,903.

(30) Foreign Application Priority Data

Sep. 1, 2020   (KR) .................. 10-2020-0111281

(51) Int. Cl.
| | | |
|---|---|---|
| *G11C 16/06* | (2006.01) | |
| *G11C 7/06* | (2006.01) | |
| *G11C 7/10* | (2006.01) | |
| *G11C 16/34* | (2006.01) | |

(52) U.S. Cl.
CPC ............ *G11C 7/065* (2013.01); *G11C 7/1039* (2013.01); *G11C 7/1057* (2013.01); *G11C 7/1084* (2013.01); *G11C 16/3404* (2013.01)

(58) Field of Classification Search
CPC ...................................... G11C 7/065
USPC ...................................... 365/185.21
See application file for complete search history.

(56) References Cited

U.S. PATENT DOCUMENTS

| | | |
|---|---|---|
| 9,135,968 B2 | 9/2015 | Lee et al. |
| 9,330,775 B2 | 5/2016 | Kim et al. |
| 9,530,467 B1 | 12/2016 | Lee |
| 9,685,206 B2 | 6/2017 | Choi et al. |
| 9,972,382 B2 | 5/2018 | Han et al. |
| 10,163,518 B2 | 12/2018 | Yoon et al. |

(Continued)

*Primary Examiner* — Hoai V Ho
(74) *Attorney, Agent, or Firm* — Muir Patent Law, PLLC

(57) ABSTRACT

A memory device includes a memory cell array, a page buffer circuit, and a counting circuit. The page buffer circuit includes a first and second page buffer columns connected to the memory cell array. The first page buffer column includes a first page buffer unit and the second page buffer column includes a second page buffer unit in a first stage. The first page buffer unit performs a first sensing operation in response to a first sensing signal, and the second page buffer unit performs a second sensing operation in response to a second sensing signal. The counting circuit counts a first number of memory cells included in a first threshold voltage region from a result of the first sensing operation, and counts a second number of memory cells included in a second threshold voltage region from a result of the second sensing operation.

20 Claims, 28 Drawing Sheets

(56) References Cited

U.S. PATENT DOCUMENTS

| | | |
|---|---|---|
| 10,497,453 B2 | 12/2019 | Bang et al. |
| 11,568,903 B2* | 1/2023 | Cho .................. G11C 16/3404 |
| 2014/0119124 A1 | 5/2014 | Kim et al. |
| 2016/0276040 A1* | 9/2016 | Han ..................... G11C 13/004 |
| 2017/0123724 A1 | 5/2017 | Park et al. |
| 2019/0267104 A1 | 8/2019 | Lee et al. |
| 2020/0098433 A1 | 3/2020 | Jeon et al. |
| 2020/0098436 A1 | 3/2020 | Kim et al. |
| 2020/0202963 A1 | 6/2020 | Ko et al. |

* cited by examiner

PAGE BUFFER CIRCUIT AND MEMORY DEVICE INCLUDING THE SAME

CROSS-REFERENCE TO RELATED APPLICATION(S)

This application is a Continuation of U.S. patent application Ser. No. 17/222,024 filed on Apr. 5, 2021, now Allowed, which claims priority under 35 U.S.C. § 119 to Korean Patent Application Numbers 10-2020-0111281, filed on Sep. 1, 2020 in the Korean Intellectual Property Office, the disclosure of which is incorporated by reference herein in its entirety.

BACKGROUND

The inventive concept relates to a memory device, and more particularly, to a page buffer circuit and a memory device including the same.

Recently, in accordance with multi-functionality of information communication devices, a large capacity and high integration of memory devices are used. A memory device may include a plurality of page buffers for storing data in or outputting data from memory cells, and the plurality of page buffers may be arranged in a multi-stage structure. To improve the read reliability of the memory device, a valley search operation on a threshold voltage distribution of the memory cells may be performed. In this case, as the valley search operation is performed, read time may be increased, and thus, the read performance of the memory device may be decreased.

SUMMARY

A memory device according to technical aspects of the inventive concept includes: a memory cell array including a plurality of memory cells; a page buffer circuit including a first page buffer column and a second page buffer column connected to the memory cell array, wherein: each of the first page buffer column and the second page buffer column includes page buffer units arranged in a multi-stage structure, the first page buffer column includes a first page buffer unit in a first stage, the first page buffer unit performs a first sensing operation in response to a first sensing signal, and the second page buffer column includes a second page buffer unit in the first stage, the second page buffer unit performs a second sensing operation in response to a second sensing signal; and a counting circuit configured to count a first number of memory cells included in a first threshold voltage region from a result of the first sensing operation, and count a second number of memory cells included in a second threshold voltage region from a result of the second sensing operation.

In addition, a memory device according to technical aspects of the inventive concept includes: a memory cell array including a plurality of memory cell groups; a page buffer circuit including a plurality of page buffer groups respectively connected to the plurality of memory cell groups, wherein each of the plurality of page buffer groups includes a plurality of page buffer units arranged in a matrix form, and a plurality of first page buffer units in a first stage of each page buffer group are divided into a first group configured to perform a first sensing operation according to a first sensing signal and a second group configured to perform a second sensing operation according to a second sensing signal; a counting circuit configured to count a first number of memory cells included in a first threshold voltage region from a result of the first sensing operation, and count a second number of memory cells included in a second threshold voltage region from a result of the second sensing operation; and a control circuit configured to determine a develop time period of the plurality of first page buffer units based on a comparison result of the first number of memory cells and the second number of memory cells.

In addition, a memory device according to technical aspects of the inventive concept includes: a memory cell region including a plurality of memory cells and a first metal pad; and a peripheral circuit region including a second metal pad, the peripheral circuit region being perpendicularly connected to the memory cell region via the first metal pad and the second metal pad, wherein the peripheral circuit region includes: a page buffer circuit including a first page buffer column and a second page buffer column, wherein: each of the first page buffer column and the second page buffer column includes page buffer units arranged in a multi-stage structure, the first page buffer column includes a first page buffer unit in a first stage, the first page buffer unit performs a first sensing operation in response to a first sensing signal, and the second page buffer column includes a second page buffer unit in the first stage, the second page buffer unit performs a second sensing operation in response to a second sensing signal; and a counting circuit configured to count a first number of memory cells included in a first threshold voltage region from a result of the first sensing operation, and count a second number of memory cells included in a second threshold voltage region from a result of the second sensing operation.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, embodiments of the present disclosure are described in detail with reference to the accompanying drawings.

Figure 1:
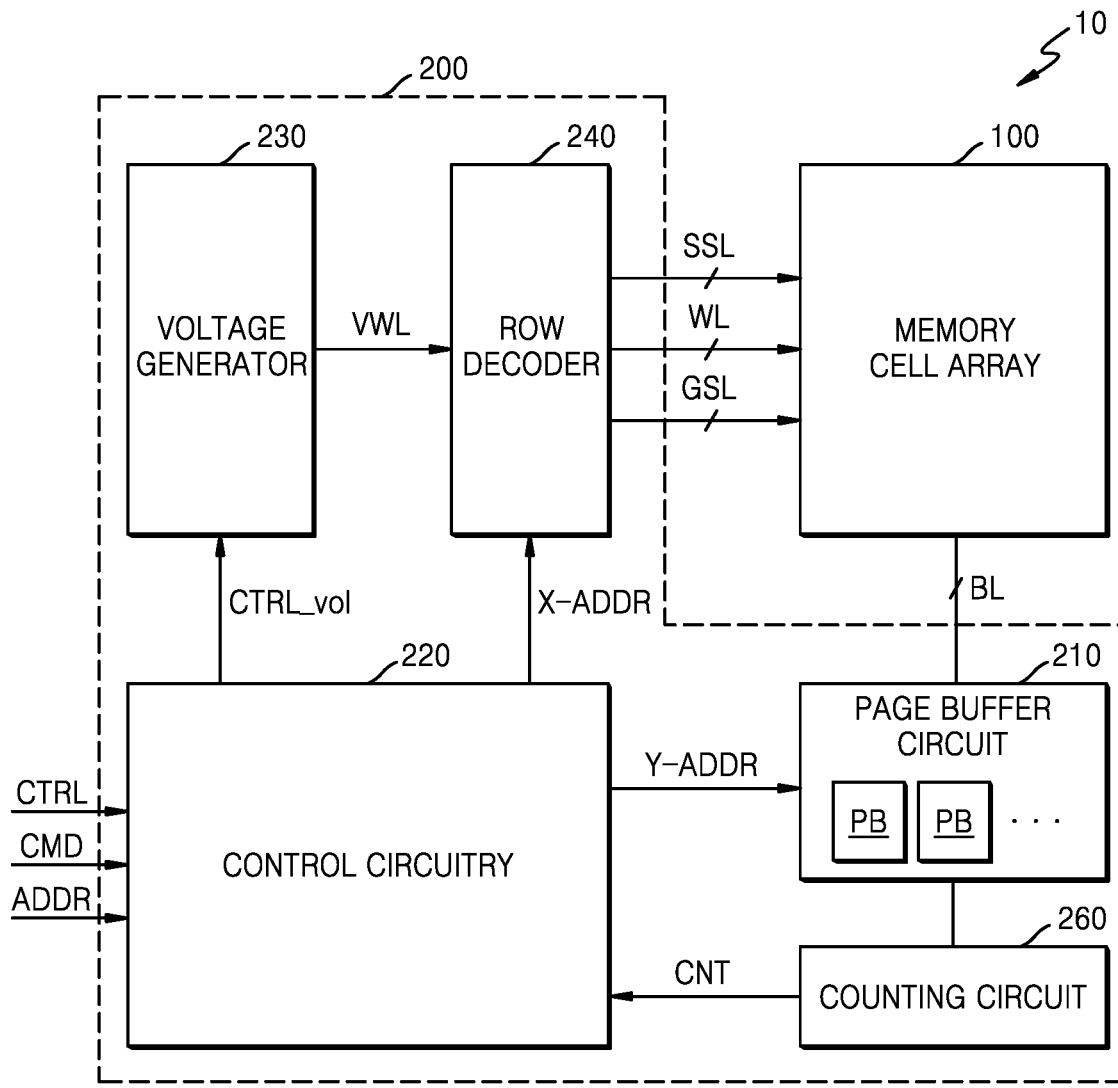
FIG. 1 is a block diagram of a memory device according to an embodiment of the inventive concept.

FIG. 1 is a block diagram of a memory device 10 according to an embodiment of the inventive concept. Referring to FIG. 1, the memory device 10 may include a memory cell array 100 and a peripheral circuit 200, and the peripheral circuit 200 may include a page buffer circuit 210, a control circuitry 220, a voltage generator 230, a row decoder 240, and a counting circuit 260. Although not illustrated in FIG. 1, the peripheral circuit 200 may further include a data input/output circuit, an input/output interface, etc.

The memory cell array 100 may be connected to the page buffer circuit 210 via bit lines BL, and may be connected to the row decoder 240 via word lines WL, string select lines SSL, and ground select lines GSL. The memory cell array 100 may include a plurality of memory blocks. Each memory block may include a plurality of memory cells, and the memory cells may include, for example, flash memory cells. Below, embodiments of the inventive concept will be described for the case in which the plurality of memory cells include NAND flash memory cells. However, the embodiment is not limited thereto. In some embodiments, the plurality of memory cells may include resistive memory cells such as resistive random access memory (RRAM), phase-change RAM (PRAM), and magneto-resistive RAM (MRAM).

In an embodiment, the memory cell array 100 may include a three-dimensional (3D) memory cell array, the 3D memory cell array may include a plurality of NAND strings, and each NAND string may include the memory cells respectively connected to word lines WL vertically stacked on a substrate. U.S. Pat. Nos. 7,679,133, 8,553,466, 8,654,587, 8,559,235, and U.S. Patent Application Publication No. 2011/0233648 disclose suitable configurations for a 3D memory array in which the 3D memory array is configured in a plurality of levels and word lines and/or bit lines are shared between levels, and are incorporated herein by reference. However, the inventive concept is not limited to thereto, and in some embodiment, the memory cell array 100 may include a two-dimensional memory cell array.

The control circuitry 220 may, based on a command CMD, an address ADDR, and a control signal CTRL, may program data in the memory cell array 100, read data from the memory cell array 100, or output various control signals for erasing data stored in the memory cell array 100, for example, a voltage control signal CTRL_vol, a row address X-ADDR, and a column address Y-ADDR. In this manner, the control circuitry 220 may control all of various operations in the memory device 10.

The voltage generator 230 may generate various kinds of voltages for performing program, read, and erase operations in the memory cell array 100 based on the voltage control signal CTRL_vol. The voltage generator 230 may generate a word line voltage VWL, for example, a program voltage, a read voltage, a pass voltage, an erase verification voltage, or a program verification voltage, and in addition, may generate a string select line voltage and a ground select line voltage.

The row decoder 240 may, in response to the row address X-ADDR, select one of the memory blocks, select one of the word lines WL of the selected memory block, and select one of the plurality of string select lines SSL. The page buffer circuit 210 may select some of the bit lines BL in response to the column address Y-ADDR. The page buffer circuit 210 may operate as a write driver or a sense amplifier according to an operation mode of the memory device 10.

The page buffer circuit 210 may include a plurality of page buffers PB respectively connected to a corresponding bit line of the plurality of bit lines BL. In an embodiment, the plurality of page buffers PB may be arranged in a matrix form including a plurality of columns and a plurality of rows. In other words, the plurality of page buffers PB may be arranged in a plurality of multi-stage structures. Hereinafter, in the description of the page buffer circuit 210, a row and a stage may mean the same.

In an embodiment, the page buffers PB included in at least one of the plurality of rows may each perform sensing operations according to different sensing signals. For example, the page buffers PB included in at least one stage of the plurality of stages may each perform sensing operations according to different sensing signals. The page buffers PB of one stage of the plurality of stages may be divided into at least a first group and a second group, the page buffers PB of the first group may perform a first sensing operation according to a first sensing signal, and the page buffers PB of the second group may perform a second sensing operation according to a second sensing signal. In this case, a first enable time point at which the first sensing signal is enabled may be different from a second enable time point at which the second sensing signal is enabled.

Figure 6:
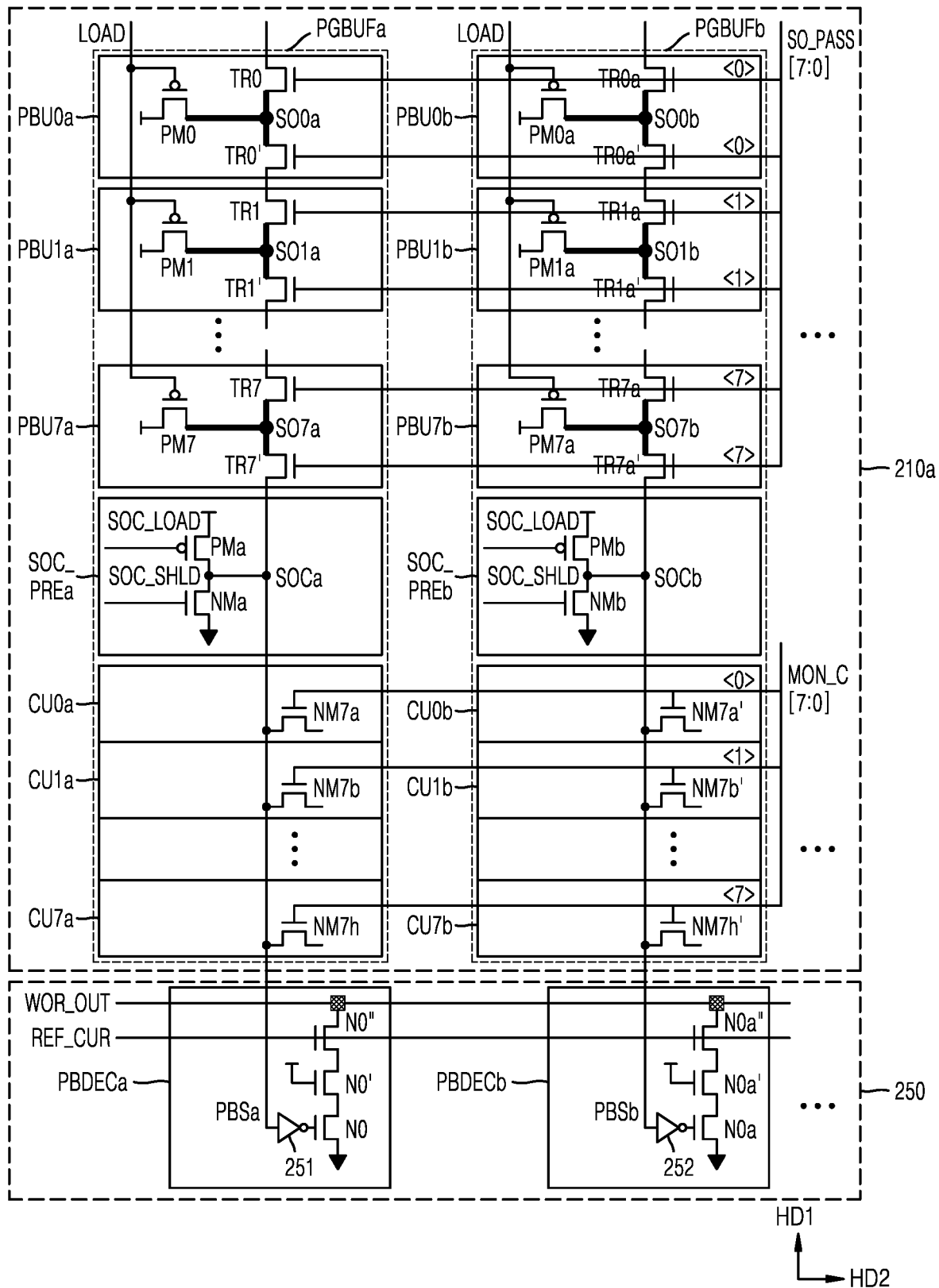
FIG. 6 illustrates circuit diagrams of a page buffer and a page buffer decoder, according to an embodiment of the inventive concept.

In an embodiment, page buffer units included in the plurality of page buffers PB (for example, first through eighth page buffer units PBU0a through PBU7a in FIG. 6) and cache units included in the plurality of page buffers PB (for example, first through eighth cache units CU0a through CU7a in FIG. 6) may be apart from each other, and may have separate structures. Accordingly, the degree of freedom of wirings on the page buffer units may be improved, and complexity of a layout may be reduced. In addition, because the cache units are arranged adjacent to data input/output lines, the distance between the cache units and the data input/output lines may be reduced, and thus, the data input/output speed may be improved.

The counting circuit 260 may count a first number of memory cells included in a first threshold voltage region from a result of the first sensing operation of the page buffers PB of the first group, and a second number of memory cells included in a second threshold voltage region from a result of the second sensing operation of the page buffers PB of the second group. The counting circuit 260 may provide a counting result CNT corresponding to the first number and the second number to the control circuitry 220.

The control circuitry 220 may receive the counting result CNT corresponding to the first number and the second number, and compare the first number to the second number, then to perform a valley search operation on a threshold voltage distribution of the memory cells. In this manner, the valley search operation performed by the memory device 10 may be referred to as 'on-chip valley search (OVS)'. In addition, the control circuitry 220 may change a development time period of the page buffers PB according to a result of the valley search operation. The control circuitry 220 may change a next development time period for the page buffers PB of the first group and the page buffers PB of the second group. In addition, the control circuitry 220 may change the development time period for the page buffers PB of other stages, according to the result of the valley search operation using the page buffers PB of one stage.

Figure 2:
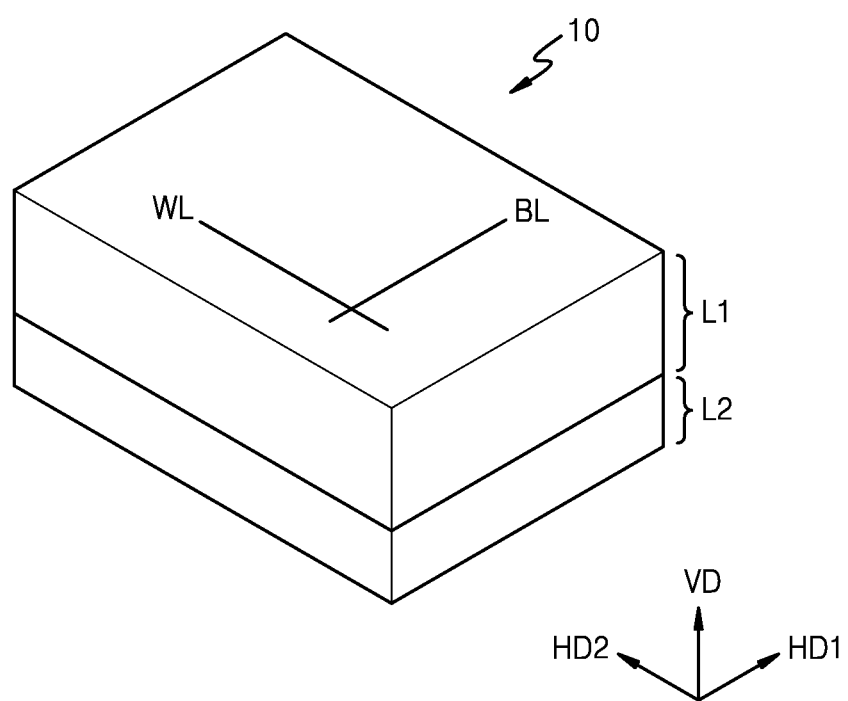
FIG. 2 schematically illustrates a structure of the memory device of FIG. 1, according to an embodiment of the inventive concept.

FIG. 2 schematically illustrates a structure of the memory device 10 of FIG. 1, according to an embodiment of the inventive concept. Referring to FIG. 2, the memory device 10 may include a first semiconductor layer L1 and a second semiconductor layer L2, and the first semiconductor layer L1 may be stacked with respect to the second semiconductor layer L2 in a vertical direction VD. The second semiconductor layer L2 may be arranged under the first semiconductor layer L1 in the vertical direction VD, and accordingly, the second semiconductor layer L2 may be arranged close to the substrate. In an embodiment, the memory cell array 100 in FIG. 1 may be formed in the first semiconductor layer L1, and the peripheral circuit 200 in FIG. 1 may be formed in the second semiconductor layer L2. Accordingly, the memory device 10 may have a structure in which the memory cell array 100 is on the peripheral circuit 200, that is, a cell over periphery or a cell on peripheral (COP) structure. The COP structure may effectively reduce an area in a horizontal direction, and improve a degree of integration of the memory device 10.

In an embodiment, the second semiconductor layer L2 may include the substrate, and by forming transistors on the substrate and metal patterns for wiring transistors, the peripheral circuit 200 may be formed in the second semiconductor layer L2. After the peripheral circuit 200 is formed in the second semiconductor layer L2, the first semiconductor layer L1 including the memory cell array 100 may be formed, and the metal patterns for connecting the word lines WL and the bit lines BL of the memory cell array 100 to the peripheral circuit 200 formed in the second semiconductor layer L2 may be formed. For example, the bit lines BL may extend in a first horizontal direction HD1, and the word lines WL may extend in a second horizontal direction HD2.

As the number of stages of memory cells in the memory cell array 100 increases with the development of semiconductor processes, that is, as the number of stacked word lines WL increases, an area of the memory cell array 100 may decrease, and accordingly, an area of the peripheral circuit 200 may also be reduced. According to the present embodiment, to reduce an area of a region occupied by the page buffer circuit 210, the page buffer circuit 210 may have a structure in which the page buffer unit is separate from a cache latch. This will be explained in detail with reference to FIG. 6.

Figure 3:
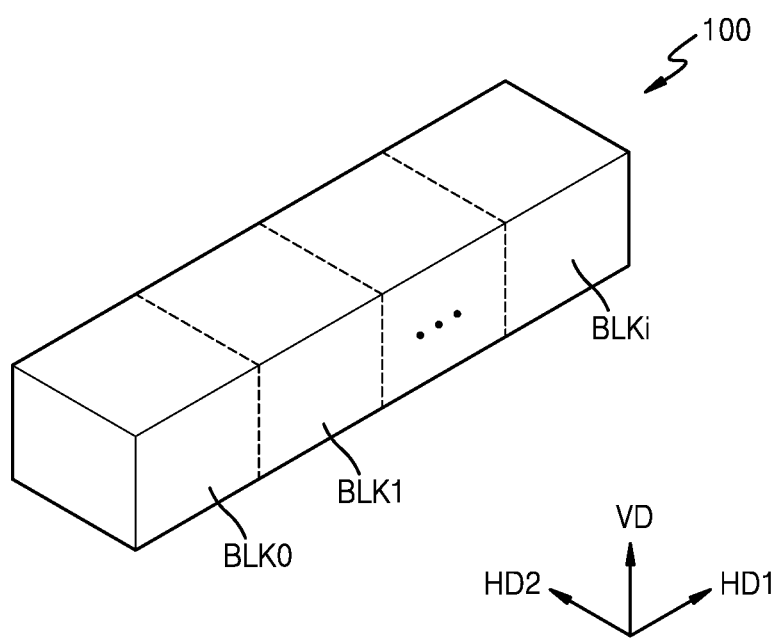
FIG. 3 schematically illustrates a memory cell array in FIG. 1, according to an embodiment of the inventive concept.

FIG. 3 exemplarily illustrates the memory cell array 100 in FIG. 1, according to an embodiment of the inventive concept. Referring to FIG. 3, the memory cell array 100 may include memory blocks BLK0 through BLKi (i is a positive integer), and each of the memory blocks BLK0 through BLKi may have a three-dimensional structure (or vertical structure). Each of the memory blocks BLK0 through BLKi may include a plurality of NAND strings extending in the vertical direction VD. Each of the memory blocks BLK0 through BLKi may be selected by the row decoder (240 in FIG. 1).

Figure 4:
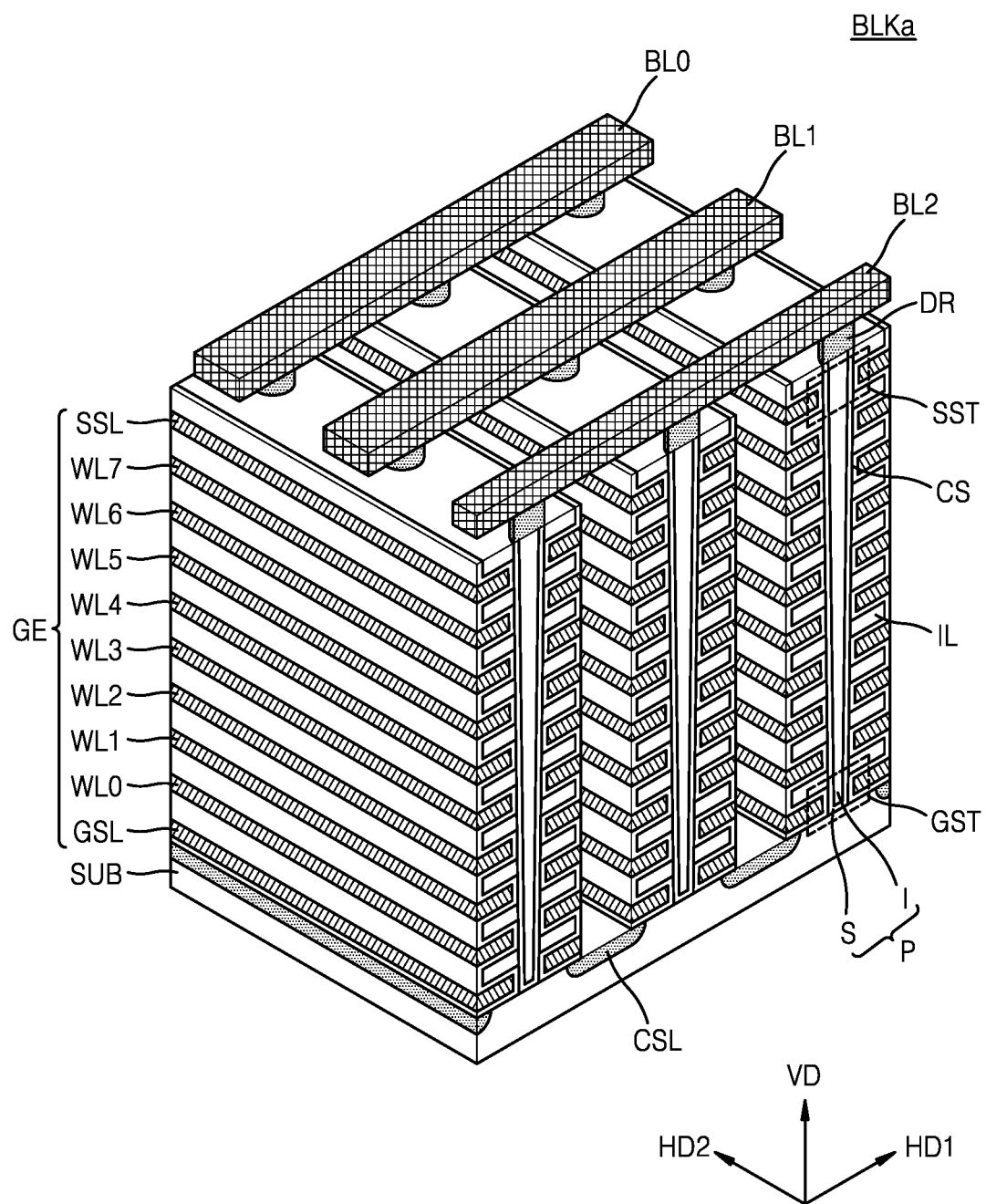
FIG. 4 is a perspective view of a memory block according to an embodiment of the inventive concept.

FIG. 4 is a perspective view of a memory block BLKa according to an embodiment of the inventive concept. Referring to FIG. 4, the memory block BLKa may be formed in a direction perpendicular to a substrate SUB. A common source line CSL extending in a second horizontal direction HD2 may be provided in the substrate SUB. In a region between two adjacent common source lines CSL in the substrate SUB, a plurality of insulating layers IL, which extend in the second horizontal direction HD2, may be sequentially provided in the vertical direction VD, and the plurality of insulating layers IL may be apart from each other by a certain distance in the vertical direction VD. A plurality of pillars P, which are arranged sequentially in the first horizontal direction HD1, and penetrate the plurality of insulating layers IL in the vertical direction VD, may be provided on a region of the substrate SUB between two adjacent common source lines CSL. A surface layer S of each pillar P may include a silicon material of a first type, and may function as a channel region. An inner layer I of each pillar P may include an insulating material such as silicon oxide or an air gap.

In the region between two adjacent common source lines CSL, a charge storage layer CS may be provided along exposed surfaces of the insulating layers IL, the pillars P, and the substrate SUB. For example, the charge storage layer CS may have an oxide-nitride-oxide (ONO) structure. In addition, in the region between two adjacent common source lines CSL, a gate electrode GE including the select lines (for example, GSL and SSL) and word lines WL0 through WL7 may be provided on an exposed surface of the charge storage layer CS. Drains DR may be provided on the plurality of pillars P, respectively. Bit lines BL0 through BL2 extending in the first horizontal direction HD1 may be provided on the drains DR.

Figure 5:
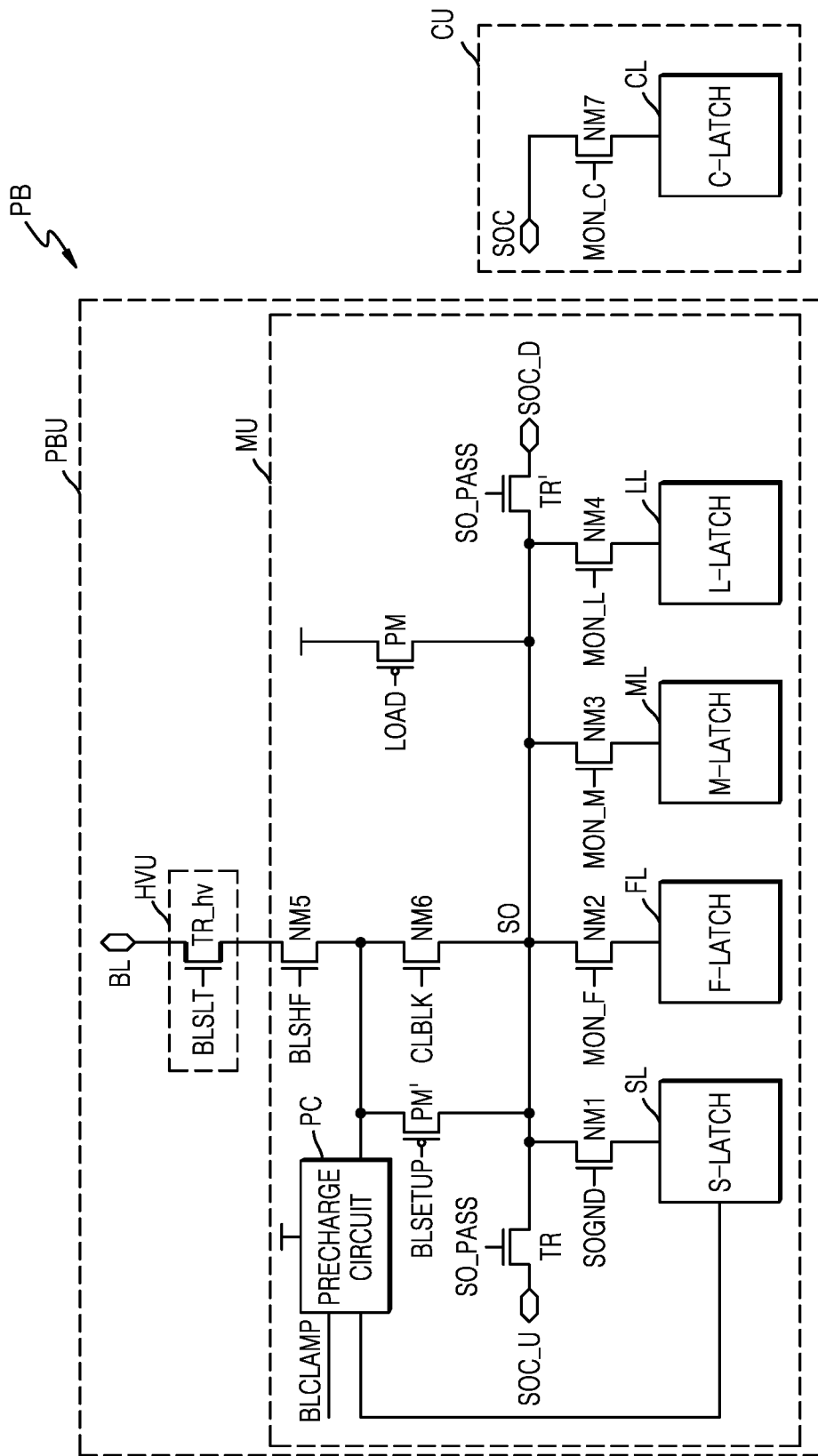
FIG. 5 illustrates in detail a page buffer according to an embodiment of the inventive concept.

FIG. 5 illustrates in detail the page buffer PB according to an embodiment of the inventive concept.

Referring to FIG. 5, the page buffer PB may include a page buffer unit PBU and a cache unit CU, and may correspond to an example of the page buffer PB in FIG. 1. Because the cache unit CU includes a cache latch (C-LATCH) CL, and the C-LATCH CL is connected to a data input/output line (not shown), the cache unit CU may be arranged adjacent to the data input/output line. Accordingly, the page buffer unit PBU may be apart from the cache unit CU, and the page buffer PB may have a structure in which the page buffer unit PBU is apart from the cache unit CU.

The page buffer unit PBU may include a main unit MU. The main unit MU may include main transistors in the page buffer PB. The page buffer unit PBU may further include a bit line select transistor TR_hv that is connected to the bit line BL and driven by a bit line select signal BLSLT. The bit line select transistor TR_hv may be implemented as a high voltage transistor, and accordingly, the bit line select transistor TR_hv may be arranged in a different well region from the main unit MU, for example, in a high voltage unit HVU.

The main unit MU may include a sensing latch (S-LATCH) SL, a force latch (F-LATCH) FL, an upper bit latch or the most significant bit latch (M-LATCH) ML, and a lower bit latch or the least significant bit latch (L-LATCH) LL. The S-LATCH SL may, during a read or program verify operation, store data stored in a memory cell MC or a sensing result of a threshold voltage of the memory cell MC. In addition, the S-LATCH SL may, during a program operation, be used to apply a program bit line voltage or a program inhibit voltage to the bit line BL. The F-LATCH FL may be used to improve the threshold voltage distribution during the program operation. The M-LATCH ML, the L-LATCH LL, and the C-LATCH CL may be utilized to store data externally input during the program operation. In addition, the main unit MU may further include a precharge circuit PC capable of controlling a precharge operation on the bit line BL or a sensing node SO based on a bit line clamping control signal BLCLAMP, and may further include a transistor PM' driven by a bit line setup signal BLSETUP.

The main unit MU may further include first through fourth transistors NM1 through NM4. The first transistor NM1 may be driven by a ground control signal SOGND, and the second transistor NM2 may be driven by a forcing monitoring signal MON_F. The third transistor NM3 may be driven by an upper bit monitoring signal MON_M, and the fourth transistor NM4 may be driven by a lower bit monitoring signal MON_L. In addition, the main unit MU may further include fifth and sixth transistors NM5 and NM6 connected to each other in series between a bit line select transistor TV_hv and the sensing node SO. The fifth transistor NM5 may be driven by a bit line shut-off signal BLSHF, and the sixth transistor NM6 may be driven by a bit line connection control signal CLBLK. In addition, the main unit MU may further include a precharge transistor PM. The precharge transistor PM may be connected to the sensing node SO, and may be driven by a load signal LOAD.

The main unit MU may further include a pair of pass transistors connected to the sensing node SO, that is, first and second pass transistors TR and TR'. The first and second pass transistors TR and TR' may be driven according to a pass control signal SO_PASS. The first pass transistor TR may be connected between a first terminal SOC_U and the sensing node SO, and the second pass transistor TR' may be connected between the sensing node SO and a second terminal SOC_D.

FIG. 6 is a circuit diagram of a page buffer circuit 210a and a page buffer decoder 250 according to an embodiment of the inventive concept.

Referring to FIG. 6, the page buffer circuit 210a may correspond to an example of the page buffer circuit 210 in FIG. 1. The page buffer circuit 210a may include a plurality of page buffer columns including first and second page buffer columns PGBUFa and PGBUFb arranged in the second horizontal direction HD2, and each of the plurality of page buffer columns may include a plurality of page buffers arranged in a multi-stage structure. For example, the first page buffer column PGBUFa may include first through eighth page buffer units PBU0a through PBU7a arranged in the first horizontal direction HD1 and first through eighth cache units CU0a through CU7a arranged in the first horizontal direction, and the second page buffer column PGBUFb may include first through eighth page buffer units PBU0b through PBU7b arranged in the first horizontal direction HD1 and first through eighth cache units CU0b through CU7b arranged in the first horizontal direction. For example, each of the first to eighth page buffer units PBU0a through PBU7a and PBU0b through PBU7b may be implemented substantially similar to the page buffer unit PBU in FIG. 5, and each of the first to eighth cache units CU0a through CU7a and CU0b through CU7b may be implemented substantially similar to the cache unit CU in FIG. 5, and the descriptions given above with reference to FIG. 5 may be applied to the present embodiment. Hereinafter, a configuration of the first page buffer column PGBUFa is described in detail, and the description of the first page buffer column PGBUFa may also be applied to the second page buffer column PGBUFb.

The first page buffer unit PBU0a may include first and second pass transistors TR0 and TR0' connected to each other in series, and the second page buffer unit PBU1a may include first and second pass transistors TR1 and TR1' connected to each other in series. A first pass control signal SO_PASS<0> and a second pass control signal SO_PASS<1> of pass control signals SO_PASS[7:0] may be applied to gates of the first and second pass transistors TR0, TR0', TR1, and TR1', respectively. According to the present embodiment, when the pass control signals SO_PASS[7:0] are activated, the first and second pass transistors TR0 through TR7 and TR0' through TR7' may be turned on, and accordingly, the first and second pass transistors TR0 through TR7 and TR0' through TR7' included in each of the first through eighth page buffer units PBU0a through PBU7a may be connected to each other in series, and first through eighth sensing nodes SO0 through SO7 may all be connected to a combined sensing node SOCa.

Each of the first through eighth page buffer units PBU0a through PBU7a may further include first through eighth precharge transistors PM0 through PM7. In the first page buffer unit PBU0a, the first precharge transistor PM0 may be connected between the first sensing node SO0a and a voltage terminal to which a precharge level is applied, and may include a gate to which the load signal LOAD is applied. The first precharge transistor PM0 may precharge the first sensing node SO0a to the precharge level in response to the load signal LOAD.

The first cache unit CU0a may include a monitor transistor NM7a, and for example, the monitor transistor NM7a may correspond to the transistor NM7 in FIG. 5. A source S of the monitor transistor NM7a may be connected to the first combined sensing node SOCa, and a first cache monitoring signal MON_C<0> of cache monitoring signals MON_C[7:0] may be applied to a gate of the monitor transistor NM7a. The monitor transistors NM7a through NM7h included in each of the first through eighth cache units CU0a through CU7a may be commonly connected in parallel to the first combined sensing node SOCa. A source of each of the monitor transistors NM7a through NM7h may be commonly connected to the first combined sensing node SOCa.

The page buffer circuit 210a may include a precharge circuit SOC_PREa between the eighth page buffer unit PBU7a and the first cache unit CU0a, and a precharge circuit SOC_PREb between the eighth page buffer unit PBU7b and the first cache unit CU0b. The precharge circuit SOC_PREa may include a precharge transistor PMa and a shielding transistor NMa for precharging the first combined sensing node SOCa. The precharge transistor PMa may be driven by a combined sensing node load signal SOC_LOAD. The shielding transistor NMa may be driven by a combined sensing node shielding signal SOC_SHLD. The page buffer decoder 250 may be arranged adjacent to the page buffer circuit 210a in the first horizontal direction HD1, and may include a plurality of page buffer decoders including a first page buffer decoder PBDECa and a second page buffer decoder PBDECb, which are arranged in the second horizontal direction HD2. The first and second page buffer decoders PBDECa and PBDECb may be connected to the first and second page buffer columns PGBUFa and PGBUFb, respectively. For example, the first page buffer decoder PBDECa may generate a decoder output signal according to a sensing result stored in the sensing latch of the first page buffer unit PBU0a included in the first page buffer column PGBUFa.

The first page buffer decoder PBDECa may include an inverter 251 and transistors N0, N0', and N0", which are connected to each other in series, and the second page buffer decoder PBDECb may include an inverter 252 and transistors N0a, N0a', and N0a", which are connected to each other in series. The inverter 251 may receive a first page buffer signal PBSa from the first page buffer column PGBUFa, and a reference current signal REF_CUR may be applied to a gate of the transistor N0". The inverter 252 may receive a second page buffer signal PBSb from the second page buffer column PGBUFb, and the reference current signal REF_CUR may be applied to a gate of the transistor N0a".

For example, the first and second page buffer decoders PBDECa and PBDECb may receive the first and second page buffer signals PBSa and PBSb from the first page buffer units PBU0a and PBU0b, respectively. For example, when a logic low is stored in a sensing latch of the page buffer unit PBU0a, the voltage levels of the first sensing node SO0a and the first combined sensing node SOCa may be logic lows, and the first page buffer signal PBSa may correspond to logic low, which is the voltage level of the first sensing node SO0a. In this case, the inverter 251 may output a logic high signal, and accordingly, the transistor N0 may be turned on, and then, the first page buffer decoder PBDECa may operate as a current sink.

The transistor N0" may output a first signal, that is, a reference current, to a wired OR output line WOR_OUT based on the reference current signal REF_CUR. In this case, when the transistor N0" is turned on according to the reference current signal REF_CUR, the reference current may correspond to a current flowing through the transistor N0". Similarly, the transistor N0a" may output a second signal, that is, a reference current, to the wired OR output line WOR_OUT based on the reference current signal REF_CUR. The wired OR output line WOR_OUT may be commonly connected to the first and second page buffer decoders PBDECa and PBDECb, and accordingly, the first and second signals output from the first and second page buffer decoders PBDECa and PBDECb may be accumulated in the wired OR output line WOR_OUT, and then may be generated as output signals. For example, the output signal of the wired OR output line WOR_OUT may correspond to a current signal flowing through the wired OR output line WOR_OUT.

Figure 7:
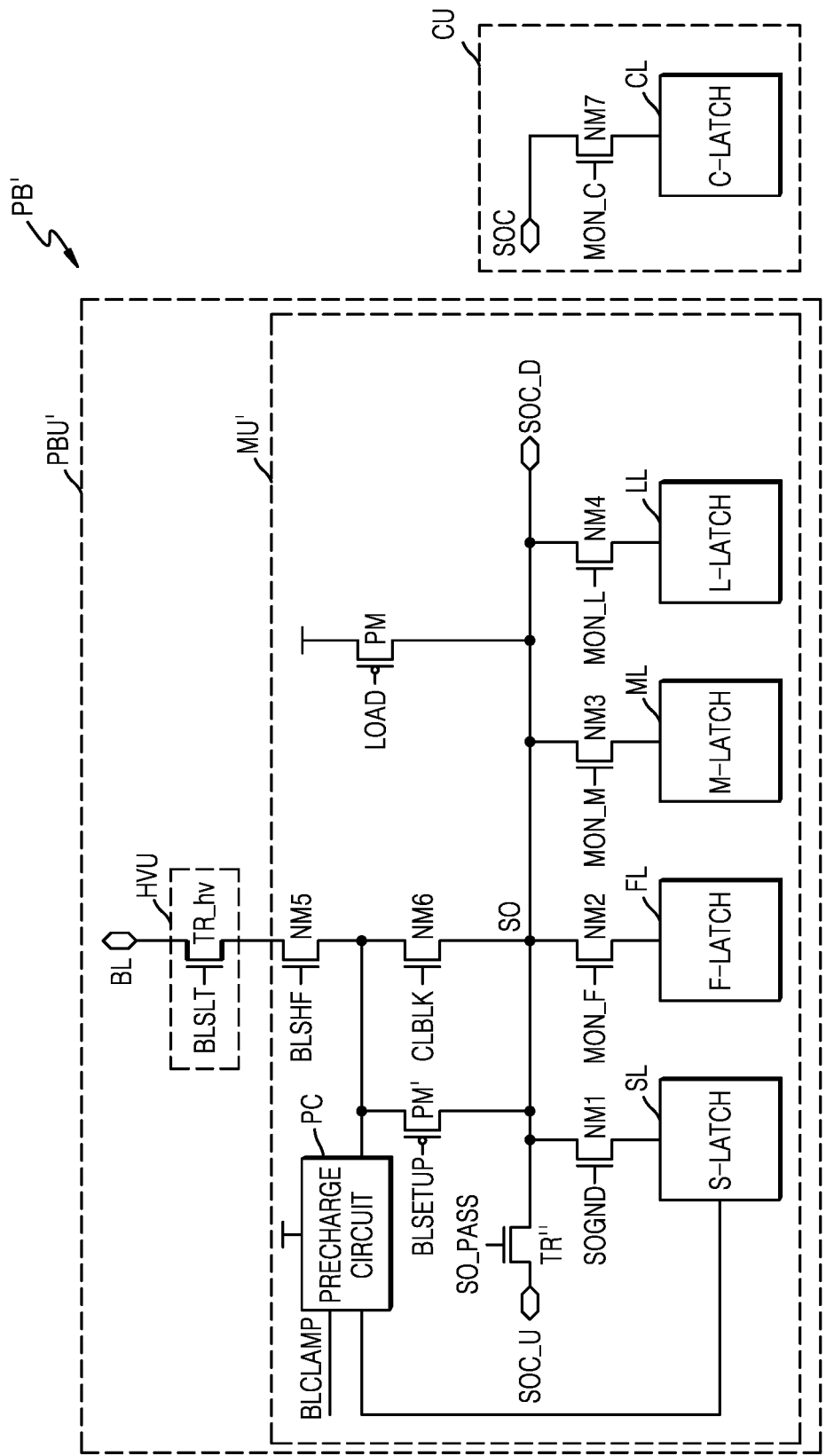
FIG. 7 illustrates in detail a page buffer according to an embodiment of the inventive concept.

FIG. 7 illustrates in detail a page buffer PB' according to an embodiment of the inventive concept. Referring to FIG. 7, the page buffer PB' may include a page buffer unit PBU' and the cache unit CU, and the page buffer unit PBU' may include a main unit MU' and the high voltage unit HVU. The page buffer PB' may correspond to a modified example of the page buffer PB in FIG. 5, and the descriptions given above with reference to FIG. 5 may be applied to the present embodiment. While the page buffer unit PBU in FIG. 5 includes the first and second pass transistors TR and TR', the page buffer unit PBU' according to the present embodiment may include one pass transistor TR". The pass transistor TR" may be driven according to the pass control signal SO_PASS, and may be connected between the first terminal SOC_U and the second terminal SOC_D.

Figure 8:
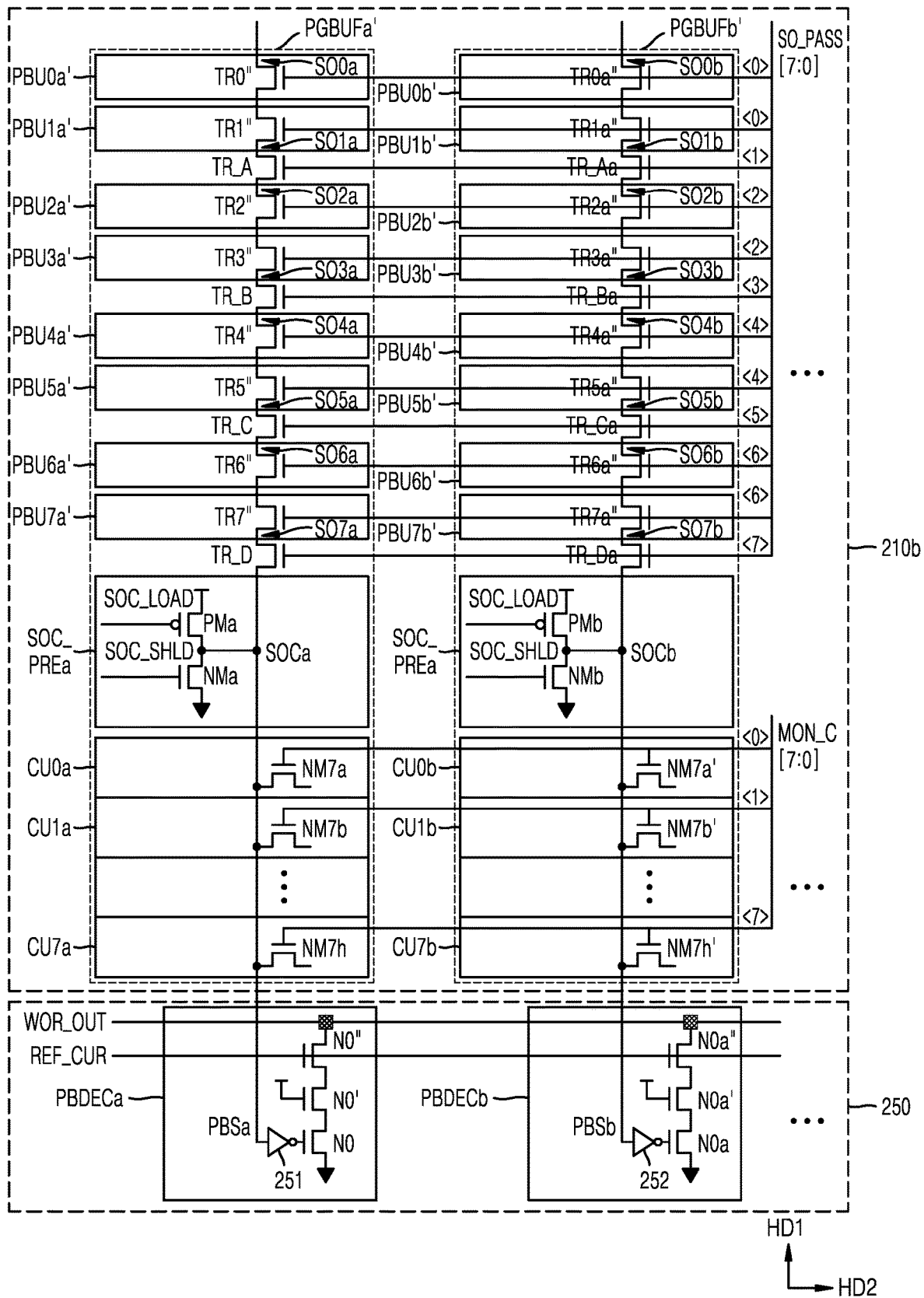
FIG. 8 illustrates circuit diagrams of a page buffer and a page buffer decoder, according to an embodiment of the inventive concept.

FIG. 8 is a circuit diagram of a page buffer circuit 210b and the page buffer decoder 250 according to an embodiment of the inventive concept.

According to FIG. 8, the page buffer circuit 210b may include a plurality of page buffer columns including a first page buffer column PGBUFa' and a second page buffer column PGBUFb', which are arranged in the second horizontal direction HD2, and each of the plurality of page buffer columns may include a plurality of page buffers arranged in a multi-stage structure. For example, the first page buffer column PGBUFa' may include first through eighth page buffer units PBU0a' through PBU7a' arranged in the first horizontal direction HD1 and first through eighth cache units CU0a through CU7a arranged in the first horizontal direction HD1, and the second page buffer column PGBUFb' may include first through eighth page buffer units PBU0b' through PBU7b' arranged in the first horizontal direction HD1 and first through eighth cache units CU0b through CU7b arranged in the first horizontal direction HD1. Hereinafter, a configuration of the first page buffer column PGBUFa' is described in detail, and the description of the first page buffer column PGBUFa' may also be applied to the second page buffer column PGBUFb'.

The first through eighth page buffer units PBU0a' through PBU7a' may include first through eighth pass transistor TR0" through TR7", respectively, and the first page buffer column PGBUFa' may further include four pass transistors TR_A through TR_D. Accordingly, the first page buffer column PGBUFa' may include twelve pass transistors TR0" through TR7" and TR_A through TR_D, which may be connected to each other in series. The pass transistor TR_A may be between a second page buffer unit PBU1a' and a third page buffer unit PBU2a', the pass transistor TR_B may be between a fourth page buffer unit PBU3a' and a fifth page buffer unit PBU4a', the pass transistor TR_C may be between a sixth page buffer unit PBU5a' and a seventh page buffer unit PBU6a', and the pass transistor TR_D may be between an eighth page buffer unit PBU7a' and the precharge circuit SOC_PREa.

A first pass control signal SO_PASS<0> may be applied to gates of the pass transistors TR0" and TR1", respectively, and a second pass control signal SO_PASS<1> may be applied to a gate of the pass transistor TR_A. A third pass control signal SO_PASS<2> may be applied to gates of the pass transistors TR2" and TR3", respectively, and a fourth pass control signal SO_PASS<3> may be applied to a gate of the pass transistor TR_B. A fifth pass control signal SO_PASS<4> may be applied to gates of the pass transistors TR4" and TR5", respectively, and a sixth pass control signal SO_PASS<5> may be applied to a gate of the pass transistor TR_C. A seventh pass control signal SO_PASS<6> may be applied to gates of the pass transistors TR6" and TR7", respectively, and an eighth pass control signal SO_PASS<7> may be applied to a gate of the pass transistor TR_D.

The page buffer decoder 250 may be arranged adjacent to the page buffer circuit 210b in the first horizontal direction HD1, and may include a plurality of page buffer decoders including the first and second page buffer decoders PBDECa and PBDECb, which are arranged in the second horizontal direction HD2. The first and second page buffer decoders PBDECa and PBDECb may be implemented substantially similar to the first and second page buffer decoders PBDECa and PBDECb in FIG. 6, and thus, repeated descriptions thereof are omitted.

Figure 9:
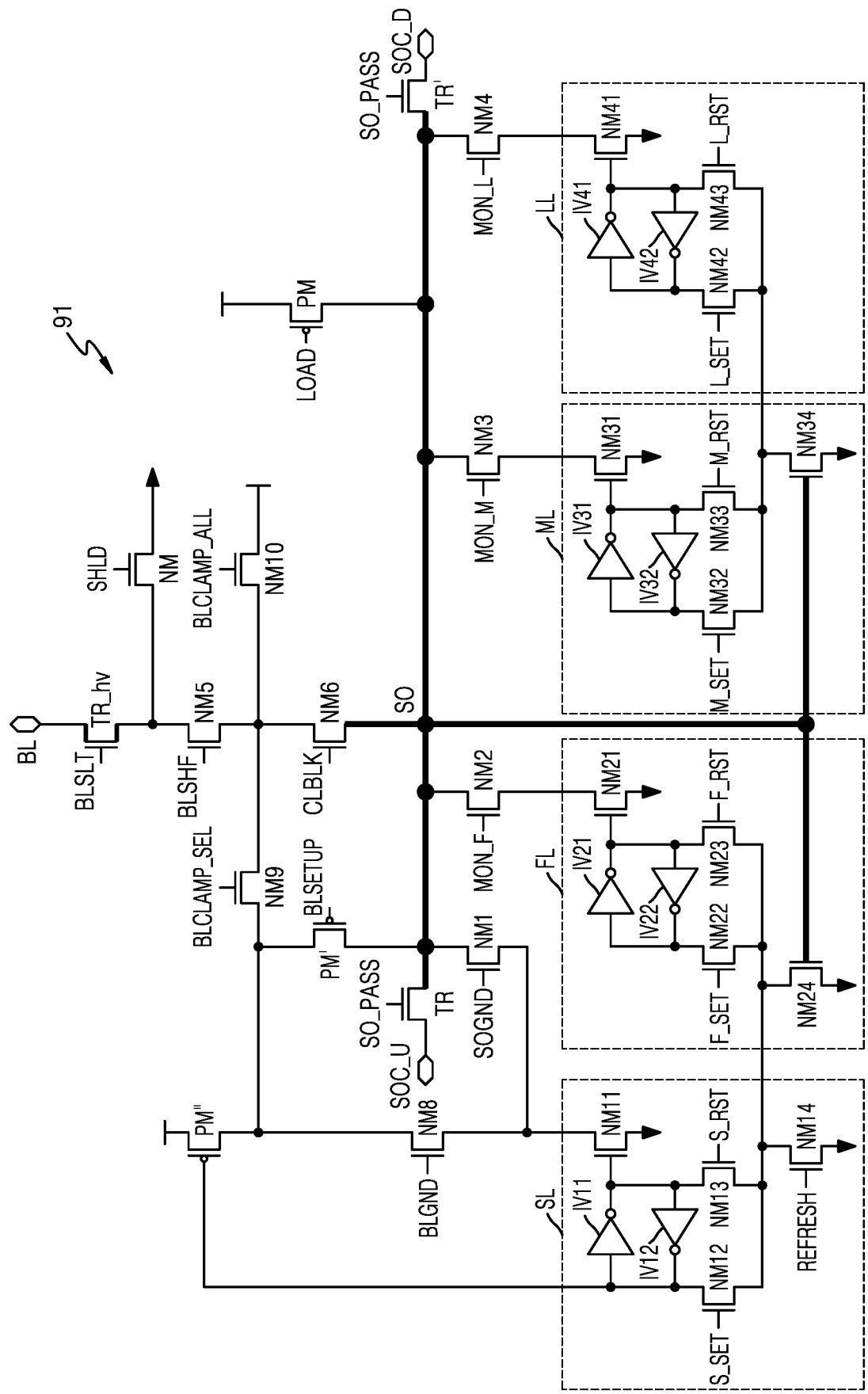
FIG. 9 is a circuit diagram of a page buffer unit according to an embodiment of the inventive concept.

FIG. 9 is a circuit diagram of a page buffer unit 91 according to an embodiment of the inventive concept.

Referring to FIG. 9, the page buffer unit 91 may correspond to, for example, the page buffer unit PBU in FIG. 5, and the descriptions given above with reference to FIG. 5 may also be applied to the present embodiment. The S-LATCH SL may include inverters IV11 and IV12, and transistors NM11 through NM14. A set signal S_SET may be applied to a gate of the transistor NM12, a reset signal S_RST may be applied to a gate of the transistor NM13, and a refresh signal REFRESH may be applied to a gate of the transistor NM14. In an embodiment, sensing signals for enabling the sensing operation of the page buffer unit 91 may include the set signal S_SET and the reset signal S_RST applied to the S-LATCH SL.

The F-LATCH FL may include inverters IV21 and IV22 and transistors NM21 through NM24, a set signal F_SET may be applied to a gate of the transistor NM22, a reset signal F_RST may be applied to a gate of the transistor NM23, and a gate of the transistor NM24 may be connected to the sensing node SO. The M-LATCH ML may include inverters IV31 and IV32 and transistors NM31 through NM34, a set signal M_SET may be applied to a gate of the transistor NM32, a reset signal M_RST may be applied to a gate of the transistor NM33, and a gate of the transistor NM34 may be connected to the sensing node SO. The L-LATCH LL may include inverters IV41 and IV42 and transistors NM41 through NM43, a set signal L_SET may be applied to a gate of the transistor NM42, and a reset signal L_RST may be applied to a gate of the transistor NM43.

In addition, the page buffer unit 91 may further include a transistor PM" connected to the S-LATCH SL, an eighth transistor NM8 driven by a bit line ground signal BLGND, a ninth transistor NM9 driven by a bit line clamping select signal BLCLAMP_SEL, a tenth transistor NM10 driven by a bit line clamping signal BLCLAMP_ALL, and a transistor NM driven by a shielding signal SHLD.

Figure 10:
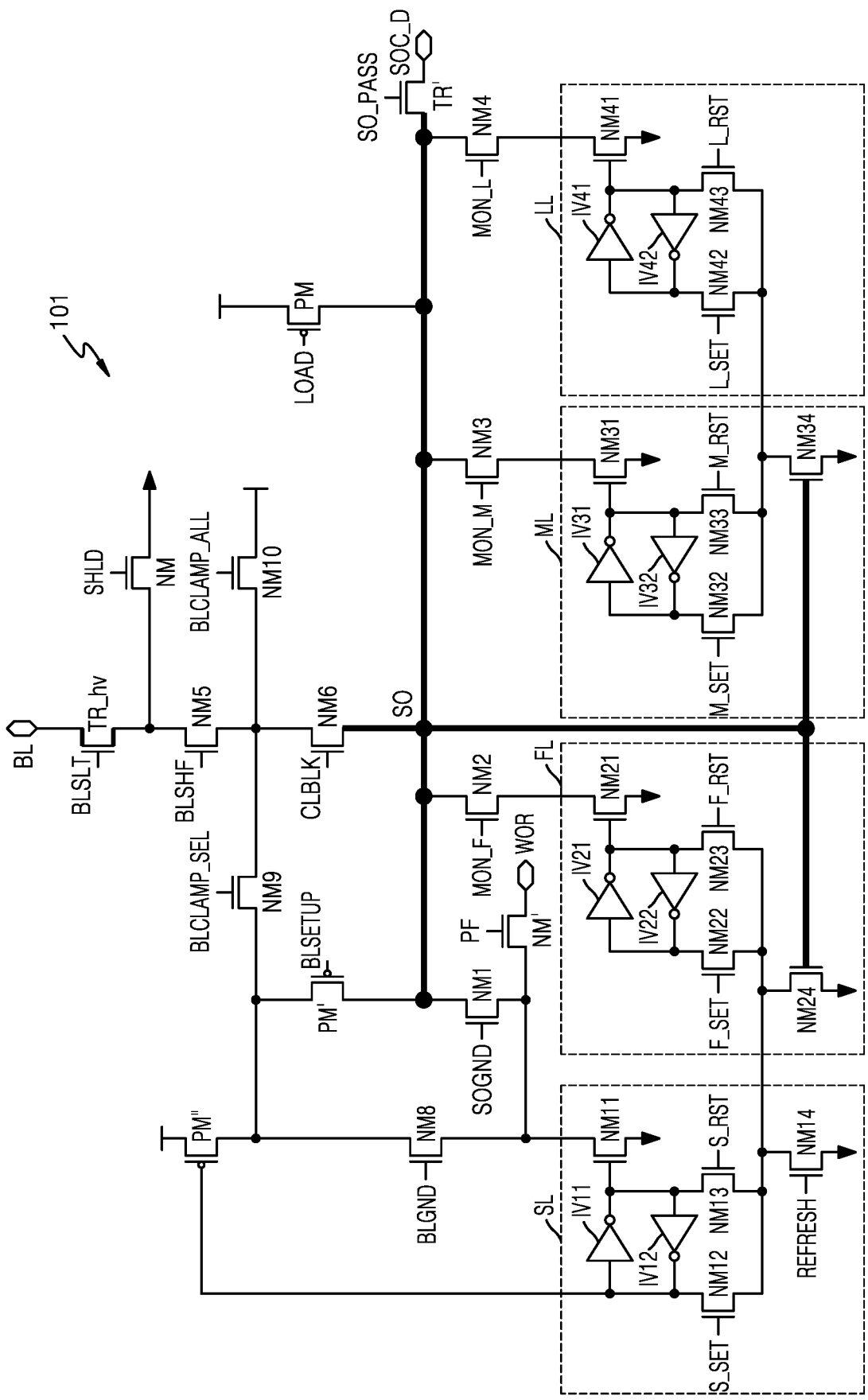
FIG. 10 is a detailed circuit diagram of a page buffer unit according to an embodiment of the inventive concept.

FIG. 10 is a detailed circuit diagram of a page buffer unit 101 according to an embodiment of the inventive concept. Referring to FIG. 10, the page buffer unit 101 may correspond to a modified example of the page buffer unit 91 in FIG. 9. The page buffer unit 101 may further include a transistor NM' connected to a wired OR terminal WOR. The transistor NM' may be arranged between the first transistor NM1 and the wired OR terminal WOR, and may be driven by a control signal PF. While the page buffer unit 91 in FIG. 9 includes the first and second pass transistors TR and TR', the page buffer unit 101 according to the present embodiment may include one pass transistor TR'.

Figure 11:
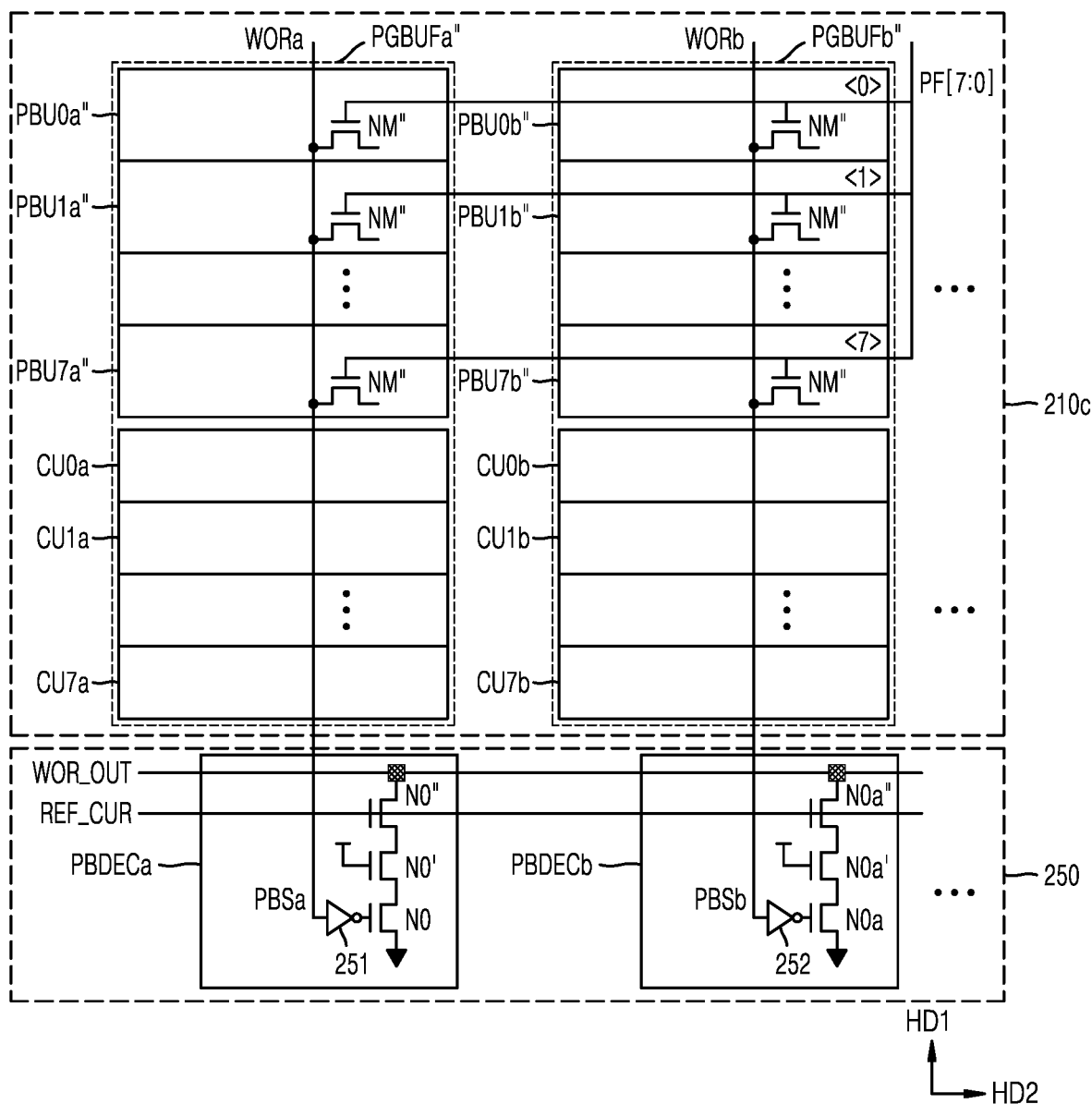
FIG. 11 illustrates circuit diagrams of a page buffer and a page buffer decoder, according to an embodiment of the inventive concept.

FIG. 11 is a circuit diagram of a page buffer circuit 210c and the page buffer decoder 250 according to an embodiment of the inventive concept.

According to FIG. 11, the page buffer circuit 210c may include a plurality of page buffer columns including a first page buffer column PGBUFa" and a second page buffer column PGBUFb", which are arranged in the second horizontal direction HD2, and each of the plurality of page buffer columns may include a plurality of page buffers arranged in a multi-stage structure. For example, the first page buffer column PGBUFa" may include first through eighth page buffer units PBU0a" through PBU7a" arranged in the first horizontal direction HD1 and first through eighth cache units CU0a through CU7a arranged in the first horizontal direction HD1, and the second page buffer column PGBUFb" may include first through eighth page buffer units PBU0b" through PBU7b" arranged in the first horizontal direction HD1 and first through eighth cache units CU0b through CU7b arranged in the first horizontal direction HD1.

A wired OR terminal WORa may be connected in parallel to a transistor NM" included in each of the first through eighth page buffer units PBU0a" through PBU7a". A wired OR terminal WORb may be connected in parallel to the transistor NM" included in each of the first through eighth page buffer units PBU0b" through PBU7b". A control signal PF[7:0] may be applied to a gate of each of the transistors NM". According to the present embodiment, when the control signal PF[7:0] is activated, the transistors NM" may be turned on. In this case, the wired OR terminal WORa may not be connected to the first through eighth cache units CU0a through CU7a, but may be connected to the first page buffer decoder PBDECa. Similarly, the wired OR terminal WORb may not be connected to the first through eighth cache units CU0b to CU7b, but may be connected to the second page buffer decoder PBDECb.

The page buffer decoder 250 may be arranged adjacent to the page buffer circuit 210c in the first horizontal direction HD1, and may include a plurality of page buffer decoders including the first and second page buffer decoders PBDECa and PBDECb, which are arranged in the second horizontal direction HD2. The first and second page buffer decoders PBDECa and PBDECb may be implemented substantially similar to the first and second page buffer decoders PBDECa and PBDECb in FIG. 6, and thus, repeated descriptions thereof are omitted.

Figure 12:
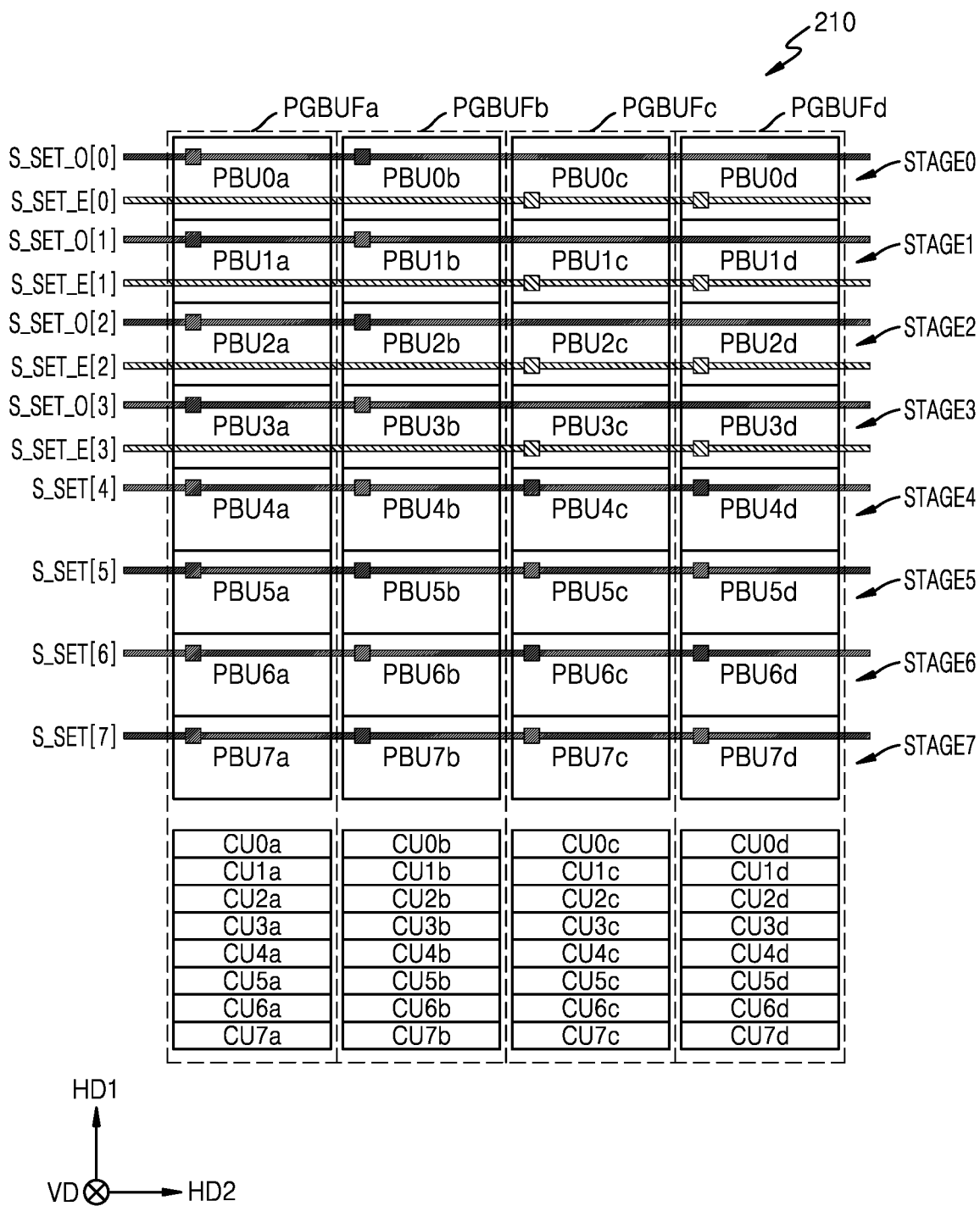
FIG. 12 illustrates a page buffer circuit according to an embodiment of the inventive concept.

FIG. 12 illustrates the page buffer circuit 210 according to an embodiment of the inventive concept.

Referring to FIG. 12, the page buffer circuit 210 may include first through fourth page buffer columns PGBUFa through PGBUFd, which are arranged in the second horizontal direction HD2, and the first through fourth page buffer columns PGBUFa through PGBUFd may have an eight-stage structure including first through eighth stages STAGE0 through STAGE7. First set signal lines S_SET_O[0] through S_SET_O[3] and second set signal lines S_SET_E_[0] through S_SET_E_[3] may be arranged above the first page buffer units PBU0a to PBU0d, the second page buffer units PBU1a to PBU1d, the third page buffer units PBU2a to PBU2d, and the fourth page buffer units PBU3a to PBU3d of the first through fourth stages STAGE0 through STAGE3 in the vertical direction VD, respectively, and may extend in the second horizontal direction HD2. Set signal lines S_SET[4] through S_SET[7] may be arranged above the fifth page buffer units PBU4a to PBU4d, the sixth page buffer units PBU5a to PBU5d, the seventh page buffer units PBU5a to PBU6d, and the eighth page buffer units PBU7a to PBU7d of the fifth through eighth stages STAGE4 through STAGE7 in the vertical direction VD, respectively, and may extend in the second horizontal direction HD2.

In the first stage STAGE0, the first page buffer units PBU0a and PBU0b may be connected to a first set signal line S_SET_O[0], and may perform a first sensing operation according to the first set signal S_SET_O. In the first stage STAGE0, first page buffer units PBU0c and PBU0d may be connected to a second set signal line S_SET_E[0], and may perform a second sensing operation according to the second set signal S_SET_E. All of the fifth page buffer units PBU4a to PBU4d of the fifth stage STAGE4 may be connected to a fifth set signal line S_SET[4], and may perform a sensing operation according to the set signal S_SET.

However, the inventive concept is not limited thereto, and the first and second sensing operations by using the first and second set signals S_SET_O and S_SET_E may be performed on at least one page buffer unit of the first through eighth stages STAGE0 through STAGE7. In this case, the page buffers on which the first and second sensing operations are performed are not limited to the first through fourth stages STAGE0 through STAGE3, and may include any one of the first through eighth stages STAGE0 through STAGE7.

Figure 13:
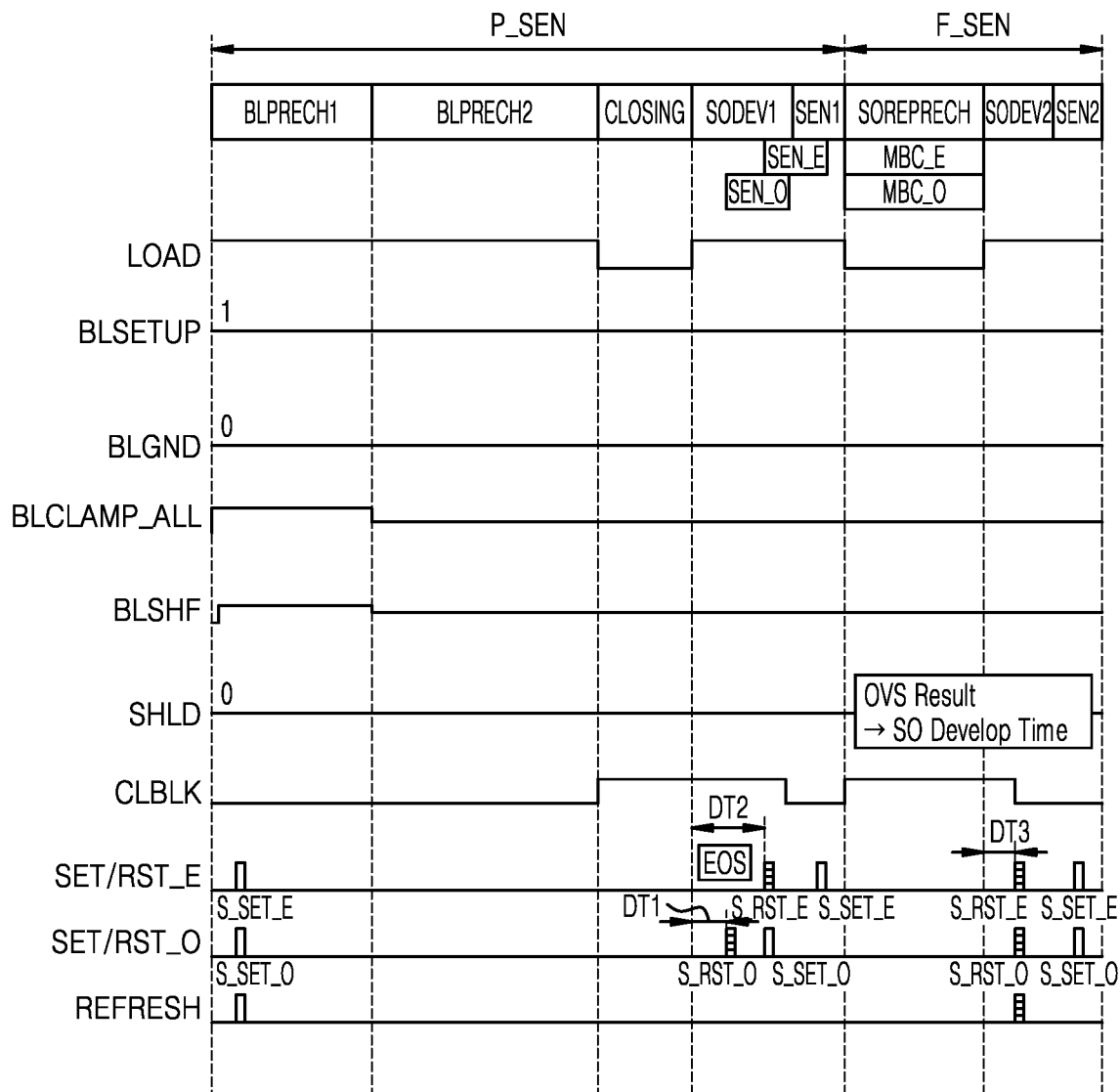
FIG. 13 is a timing diagram of a read operation of a memory device, according to an embodiment of the inventive concept.

FIG. 13 is a timing diagram of a read operation of the memory device 10, according to an embodiment of the inventive concept. Referring to FIGS. 1, 9, 12, and 13, the read operation of the memory device 10 may include a pre-sensing period P_SEN and a fine-sensing period F_SEN, the pre-sensing period P_SEN may include a first bit line pre-charge period BLPRECH1, a second bit line pre-charge period BLPRECH2, a dump closing period CLOSING, a first development period SODEV1, and a first sensing period SEN1, and the fine sensing period F_SEN may include a sensing node re-precharge period SOREPRECH, a second development period SODEV2, and a second sensing period SEN2. Herein, the pre-sensing period P_SEN may correspond to a pre-sensing operation and a fine-sensing period F_SEN may correspond to a fine sensing operation.

In the pre-sensing period P_SEN, the control circuitry 220 may differently determine a first development time period DT1 for a first group of page buffers and a second development time period DT2 for a second group of page buffers. In addition, the control circuitry 220 may determine enable time points of a first reset signal S_RST_O and a first set signal S_SET_O according to the first development time period DT1, and may determine enable time points of a second reset signal S_RST_E and a second set signal S_SET_E according to the second development time period DT2.

In the first bit line precharge period BLPRECH1, the load signal LOAD, the bit line setup signal BLSETUP, the bit line clamping signal BLCLAMP_ALL, and the bit line shutoff signal BLSHF may have a logic high level, and the bit line ground signal BLGND, the shielding signal SHLD, and the bit line connection control signal CLBLK may have a logic low level. In addition, the first set signal S_SET_O, the second set signal S_SET_E, and the refresh signal REFRESH may be enabled, and accordingly, the S-LATCH SL may be set. In the second bit line precharge period BLPRECH2, voltage levels of the bit line clamping signal BLCLAMP_ALL and the bit line shutoff signal BLSHF may decrease. In the dump closing period CLOSING, the load signal LOAD may have a logic low level, and the bit line connection control signal CLBLK may have a logic high level, and accordingly, the bit line BL may be connected to the sensing node SO.

For example, the first group of page buffers may include first and second page buffer columns PGBUFa and PGBUFb, and the second group of page buffers may include third and fourth page buffer columns PGBUFc and PGBUFd. In addition, for example, the read operation of the memory device 10 may correspond to a sensing operation of the first page buffer units PBU0a through PBU0d included in the first stage STAGE0. Hereinafter, an even odd sensing (EOS) operation for the first page buffer units PBU0a through PBU0d of the first stage STAGE0 are exemplarily described.

In the first development period SODEV1 and the first sensing period SEN1, the first development time period DT1 and a sensing time for the first page buffer units PBU0a and PBU0b included in the first group of page buffers may be different from the second development time period DT2 and a sensing time for the first page buffer units PBU0c and PBU0d included in the second group of page buffers. For example, the first reset signal S_RST_O may be enabled first, and then the first set signal S_SET_O and the second reset signal S_RST_E may be enabled.

Sensing nodes (for example, SO0a and SO0b in FIG. 16) of the first page buffer units PBU0a and PBU0b included in the first group of page buffers may be developed during the first development time period DT1, and the first page buffer units PBU0a and PBU0b included in the first group may of page buffers may perform a first sensing operation SEN_O from an enable time point of the first reset signal S_RST_O to an enable time point of the first set signal S_SET_O. The sensing nodes of the first page buffer units PBU0a and PBU0b being developed may mean that voltage levels of the sensing nodes of the first page buffer units PBU0a and PBU0b may maintain, decrease, or increase based on threshold voltages of memory cells. Meanwhile, sensing nodes (for example, SO0c and SO0d in FIG. 16) of the first page buffer units PBU0c and PBU0d of the second group of page buffers may be developed during the second development time period DT2, and the first page buffer units PBU0c and PBU0d included in the second group of page buffers may perform a second sensing operation SEN_E from an enable time point of the second reset signal S_RST_E to an enable time point of the second set signal S_SET_E. In this manner, an EOS operation may be performed on the first page buffer units PBU0a through PBU0d of the first stage STAGE0. The pre-sensing operation of the memory device 10 is described in more detail below with reference to FIG. 14.

In the sensing node re-precharge period SOREPRECH, the counting circuit 260 may perform a first counting operation MBC_O of counting a first number of memory cells included in the first threshold voltage region from a result of the first sensing operation SEN_O, and a second counting operation MBC_E of counting a second number of memory cells included in the second threshold voltage region from a result of the second sensing operation SEN_E. The first counting operation MBC_O and the second counting operation MBC_E may be performed at the same time, and accordingly, the time required for the counting operation may be reduced.

The control circuitry 220 may search for a valley of the threshold voltage distribution by comparing the first number of memory cells included in the first threshold voltage region to the second number of memory cells included in the second threshold voltage region. In addition, the control circuitry 220 may determine a third development time period DT3 that is optimized based on the searched valley, and may determine enable time points of the first reset signal S_RST_O and the second reset signal S_RST_E according to the determined third development time period DT3.

When each of the first through eighth stages STAGE0 through STAGE7 performs a sensing operation according to one sensing signal, sensing operations should be performed on at least two stages, for example, the first and fifth stages STAGE0 and STAGE4, to count the number of memory cells included in different threshold voltage regions. In this case, because the counting circuit 260 needs to sequentially perform a counting operation on a result of the sensing operation of the page buffer units of the first stage STAGE0, and a counting operation on a result of the sensing operation of the page buffer units of the fifth stage STAGE4, the time required for the counting operation may be lengthened.

However, according to the present embodiment, sensing operations may be performed on at least one of the first through eighth stages STAGE0 through STAGE7, for example, the first stage STAGE0, according to different sensing signals. The counting circuit 260 may significantly reduce the time required for the counting operation, by simultaneously performing the first counting operation MBC_O on the result of the first sensing operation of the page buffer units of the first group in the first stage STAGE0, and the second counting operation MBC_E on the result of the second sensing operation of the page buffer units of the second group in the first stage STAGE0.

In the second development period SODEV2 and the second sensing period SEN2, the third development time period DT3 and a sensing time for the first page buffer units PBU0$a$ and PBU0$b$ included in the first group of page buffers may be the same as the third development time period DT3 and a sensing time for the first page buffer units PBU0$c$ and PBU0$d$ included in the second group of page buffers. For example, the first and second reset signals S_RST_0 and S_RST_E may be simultaneously enabled. The sensing nodes SO0$a$ and SO0$b$ of the first page buffer units PBU0$a$ and PBU0$b$ included in the first group may be developed during the third development time period DT3, and the first page buffer units PBU0$a$ and PBU0$b$ included in the first group may perform a fine sensing operation from the enable time point of the first reset signal S_RST_O to the enable time point of the first set signal S_SET_O. Meanwhile, the sensing nodes SO0$c$ and SO0$d$ of the first page buffer units PBU0$c$ and PBU0$d$ of the second group may be developed during the third development time period DT3, and the first page buffer units PBU0$c$ and PBU0$d$ included in the second group may perform a fine sensing operation from the enable time point of the second reset signal S_RST_E to the enable time point of the second set signal S_SET_E.

Figure 14:
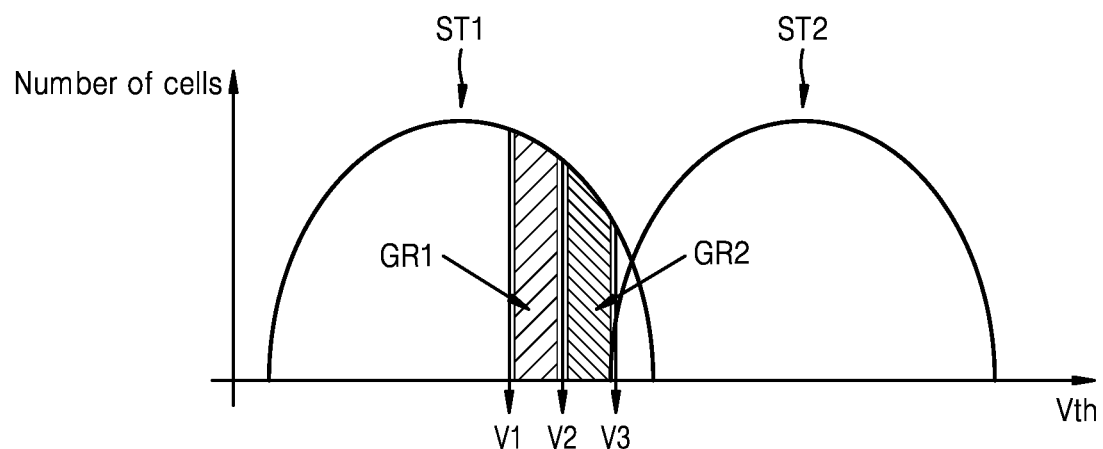
FIG. 14 illustrates a threshold voltage distribution of a memory device according to an embodiment of the inventive concept.

FIG. 14 illustrates a threshold voltage distribution of the memory device 10 according to an embodiment of the inventive concept.

Referring to FIG. 14, the horizontal axis may represent a threshold voltage Vth, and the vertical axis may represent the number of memory cells. The threshold voltage distribution of the memory device 10 may have a plurality of programs including a first program state ST1 and a second program state ST2. Hereinafter, a pre-sensing operation on a first group GR1 and a second group GR2 is described with reference to FIGS. 1, 13, and 14 together. For example, the first group GR1 may include a plurality of page buffer units including the page buffer units PBU0$a$ and PBU0$b$, and the second group GR2 may include a plurality of page buffer units including the page buffer units PBU0$c$ and PBU0$d$.

The sensing nodes SO0$a$ and SO0$b$ of the page buffer units PBU0$a$ and PBU0$b$ included in the first group GR1 may be developed during the first development time period DT1, and the page buffer units PBU0$a$ and PBU0$b$ included in the first group GR1 may perform the first sensing operation SEN_O from the enable time point of the first reset signal S_RST_O to the enable time point of the first set signal S_SET_O. In this case, the sensing at the enable time point of the first reset signal S_RST_O may correspond to a sensing at the first voltage level V1, and the sensing at the enable time point of the first set signal S_SET_O may correspond to a sensing at the second voltage level V2. Accordingly, the counting circuit 260 may count the first number of the memory cells included in the first threshold voltage region between the first voltage level V1 and the second voltage level V2 with respect to the page buffer units PBU0$a$ and PBU0$b$ of the first group GR1.

The sensing nodes SO0$c$ and SO0$d$ of the page buffer units PBU0$c$ and PBU0$d$ included in the second group GR2 may be developed during the second development time period DT2, and the page buffer units PBU0$c$ and PBU0$d$ included in the second group GR2 may perform the second sensing operation SEN_E from the enable time point of the second reset signal S_RST_E to the enable time point of the second set signal S_SET_E. In this case, the sensing at the enable time point of the second reset signal S_RST_E may correspond to a sensing at the second voltage level V2, and the sensing at the enable time point of the second set signal S_SET_E may correspond to a sensing at the third voltage level V3. Accordingly, the counting circuit 260 may count the second number of the memory cells included in the second threshold voltage region between the second voltage level V2 and the third voltage level V3 with respect to the page buffer units PBU0$c$ and PBU0$d$ of the second group GR2.

The control circuitry 220 may divide the page buffer units PBU0$a$ through PBU0$d$ of the first stage STAGE0 into the first group GR1 and the second group GR2, and vary the enable time points of the first reset signal S_RST_O and the first set signal S_SET_O applied to the first group GR1, and the second reset signal S_RST_E and the second set signal S_SET_E applied to the second group GR2 in the pre-sensing period, so that the first number of memory cells included in the first threshold voltage region and the second number of memory cells included in the second threshold voltage region may be obtained, and the OVS may be performed by using the obtained first and second numbers of memory cells. In addition, the control circuitry 220 may apply the result of the OVS to the fine sensing operation of the page buffer units PBU0$a$ through PBU0$d$ of the first stage STAGE0. In addition, the control circuitry 220 may apply the result of the OVS to the sensing operation of the page buffer units of the second through eighth stages STAGE1 through STAGE7. In this manner, according to the present embodiment, when the page buffer circuit 210 includes a plurality of multi-stage structures, the page buffer circuit 210 may not perform sensing operations for different stages, and may perform the OVS by dividing the page buffer units included in one stage, for example, the first stage STAGE0, into at least two groups including the first and second groups GR1 and GR2.

Figure 15:
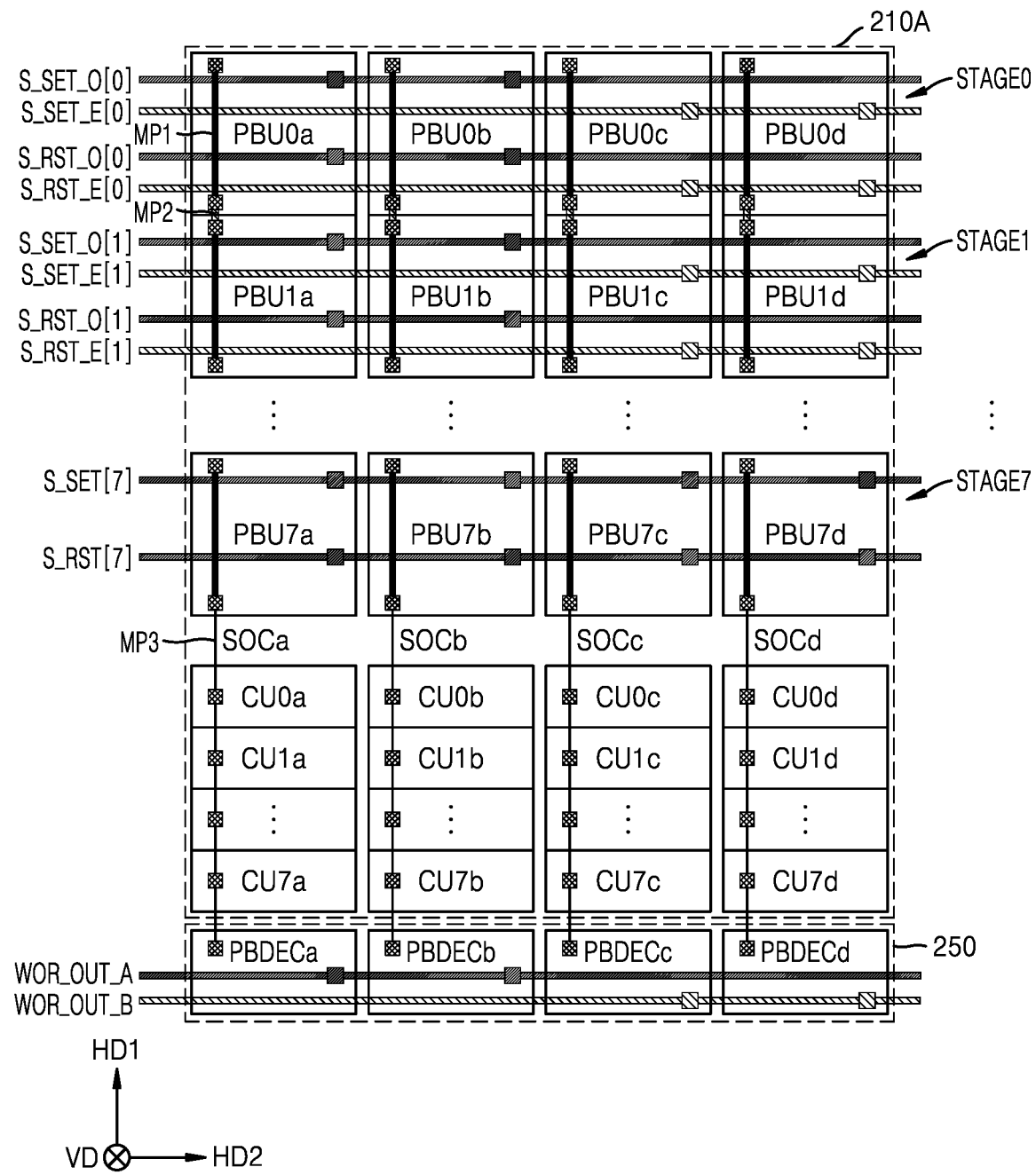
FIG. 15 exemplarily illustrates signal lines arranged above a page buffer circuit, according to an embodiment of the inventive concept.

FIG. 15 exemplarily illustrates signal lines arranged in an upper portion of a page buffer circuit 210A, according to an embodiment of the inventive concept.

Referring to FIG. 15, sensing operations by different sensing signals may be performed on each of some of the first through eighth stages STAGE0 through STAGE7 of the page buffer circuit 210A, and for each of the other stages, sensing operations by the same sensing signal may be performed. For example, the EOS may be applied to the first through fourth stages STAGE0 through STAGE3, and different sensing signals from each other may be applied to each of the first through fourth stages STAGE0 through STAGE3. For example, the EOS may not be applied to the fifth through eighth stages STAGE4 through STAGE7, and the same sensing signal may be applied to each of the fifth through eighth stages STAGE4 through STAGE7.

The first and second set signal lines S_SET_O[0] and S_SET_E[0] and first and second reset signal lines S_RST_O[0] and S_RST_E[0] may be arranged above the page buffer units PBU0a through PBU0d of the first stage STAGE0 in the vertical direction VD. The first and second set signal lines S_SET_O[0] and S_SET_E[0] and the first and second reset signal lines S_RST_O[0] and S_RST_O[0] may extend in the second horizontal direction HD2, and may be apart from each other in the first horizontal direction HD1. The first and second set signal lines S_SET_O[1] and S_SET_E[1] and first and second reset signal lines S_RST_O[1] and S_RST_E[1] may be arranged above the page buffer units PBU1a through PBU1d of the second stage STAGE1 in the vertical direction VD. The first and second set signal lines S_SET_O[1] and S_SET_E[1] and the first and second reset signal lines S_RST_O[1] and S_RST_O[1] may extend in the second horizontal direction HD2, and may be apart from each other in the first horizontal direction HD1. The set signal line S_SET[7] and a reset signal line S_RST[7] may be arranged above the page buffer units PBU7a through PBU7d of the eighth stage STAGE7 in the vertical direction VD. The set signal line S_SET[7] and the reset signal line S_RST[7] may extend in the second horizontal direction HD2, and may be spaced apart from each other in the first horizontal direction HD1.

First through third metal patterns MP1, MP2, and MP3 may be arranged above the page buffer circuit 210A and the page buffer decoder 250 in the vertical direction VD. For example, the first metal pattern MP1 may correspond to a sensing node (for example, SO in FIG. 5) of each page buffer unit, the second metal pattern MP2 may correspond to a first terminal SOC_U or a second terminal SOC_D between adjacent page buffer units, and the third metal pattern MP3 may correspond to a combined sensing node (for example, SOC in FIG. 5). The third metal patterns MP3 arranged above each of the first through fourth page buffer columns PGBUFa through PGBUFd may correspond to the first through fourth combined sensing nodes SOCa through SOCd, respectively. Wired OR output lines WOR_OUT_A and WOR_OUT_B may be arranged above the page buffer decoder 250 in the vertical direction VD, extend in the second horizontal direction HD2, and be apart from each other in the first horizontal direction HD1.

Figure 16:
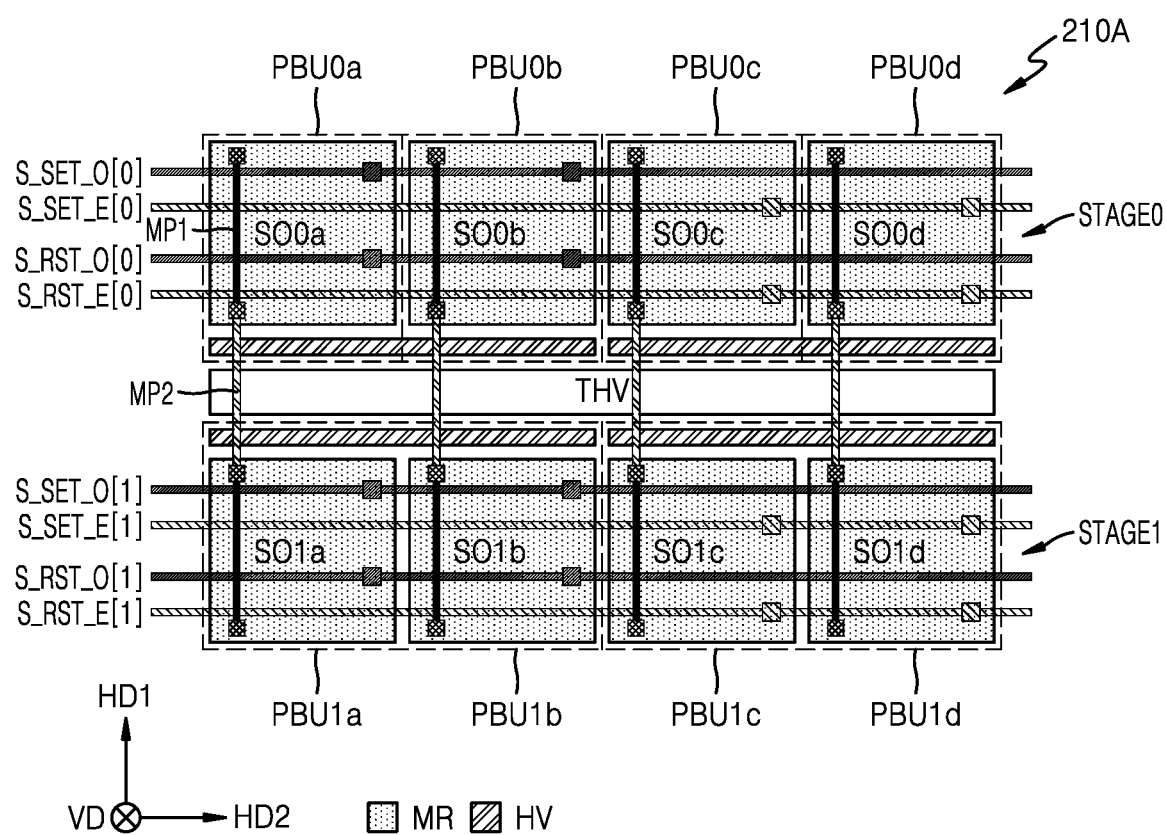
FIG. 16 illustrates a portion of the page buffer circuit in FIG. 15 in more detail, according to an embodiment of the inventive concept.

FIG. 16 illustrates a portion of the page buffer circuit 210A in FIG. 15 in more detail, according to an embodiment of the inventive concept. Referring to FIG. 16, each of the page buffer units PBU0a to PBU0d and PBU1a to PBU1d may include a first region MR and a second region HV. For example, the main unit MU in FIG. 5 or the main unit MU' in FIG. 7 may be arranged in the first region MR, and the high voltage unit HVU in FIG. 5 or 7 may be arranged in the second region HV. A contact region THV may be arranged between the first stage STAGE0 and the second stage STAGE1, and bit line contacts may be arranged in the contact region THV.

The first metal pattern MP1 arranged in the page buffer unit PBU0a may correspond to the sensing node SO0a, the first metal pattern MP1 arranged in the page buffer unit PBU1a may correspond to the sensing node SO1a, and the second metal pattern MP2 between the page buffer units PBU0a and PBU1a may correspond to the second terminal SOC_D of the page buffer unit PBU0a and the first terminal SOC_U of the page buffer unit PBU1a. Similarly, the first metal pattern MP1 arranged in the page buffer unit PBU0b may correspond to the sensing node SO0b, the first metal pattern MP1 arranged in the page buffer unit PBU1b may correspond to the sensing node SO1b, and the second metal pattern MP2 between the page buffer units PBU0b and PBU1b may correspond to the second terminal SOC_D of the page buffer unit PBU0b and the first terminal SOC_U of the page buffer unit PBU1b.

Figure 17:
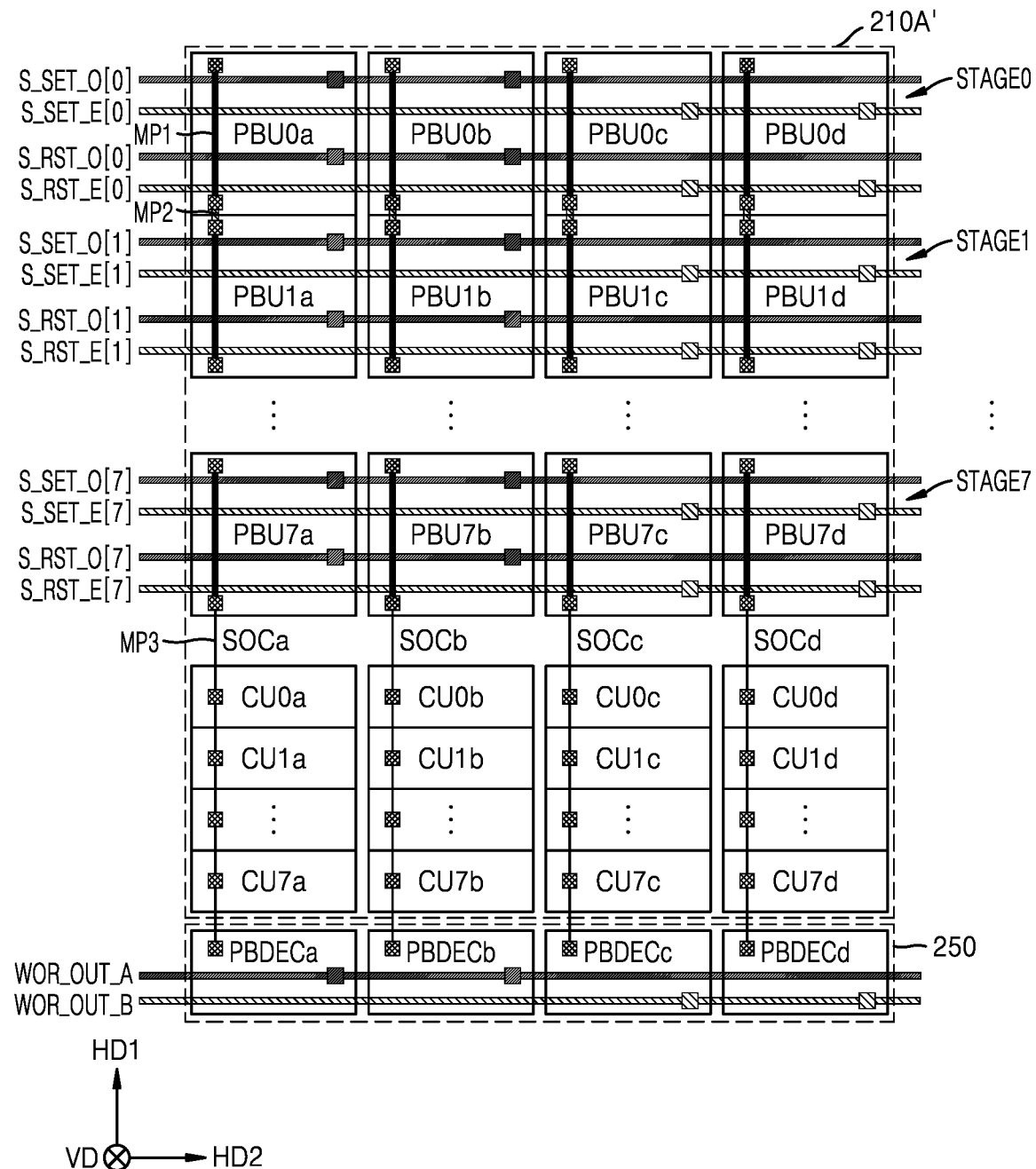
FIGS. 17 and 18 each exemplarily illustrates a signal line arranged above a page buffer circuit, according to some embodiments of the inventive concept.

FIG. 17 exemplarily illustrates signal lines arranged above a page buffer circuit 210A', according to an embodiment of the inventive concept. Referring to FIG. 17, the page buffer circuit 210A' may correspond to a modified example of the page buffer circuit 210A of FIG. 15, and sensing operations may be performed on each of the first through eighth stages STAGE0 through STAGE7 by using different sensing signals from each other. Accordingly, different sensing signals from each other may be applied to each of the first through eighth stages STAGE0 through STAGE7. For example, first and second set signal lines S_SET_O[7] and S_SET_E[7] and first and second reset signal lines S_RST_O[7] and S_RST_E[7] may be arranged above the page buffer units PBU7a through PBU7d of the eighth stage STAGE7. The first and second set signal lines S_SET_O[7] and S_SET_E[7] and the first and second reset signal lines S_RST_O[7] and S_RST_O[7] may extend in the second horizontal direction HD2, and may be apart from each other in the first horizontal direction HD1.

Figure 18:
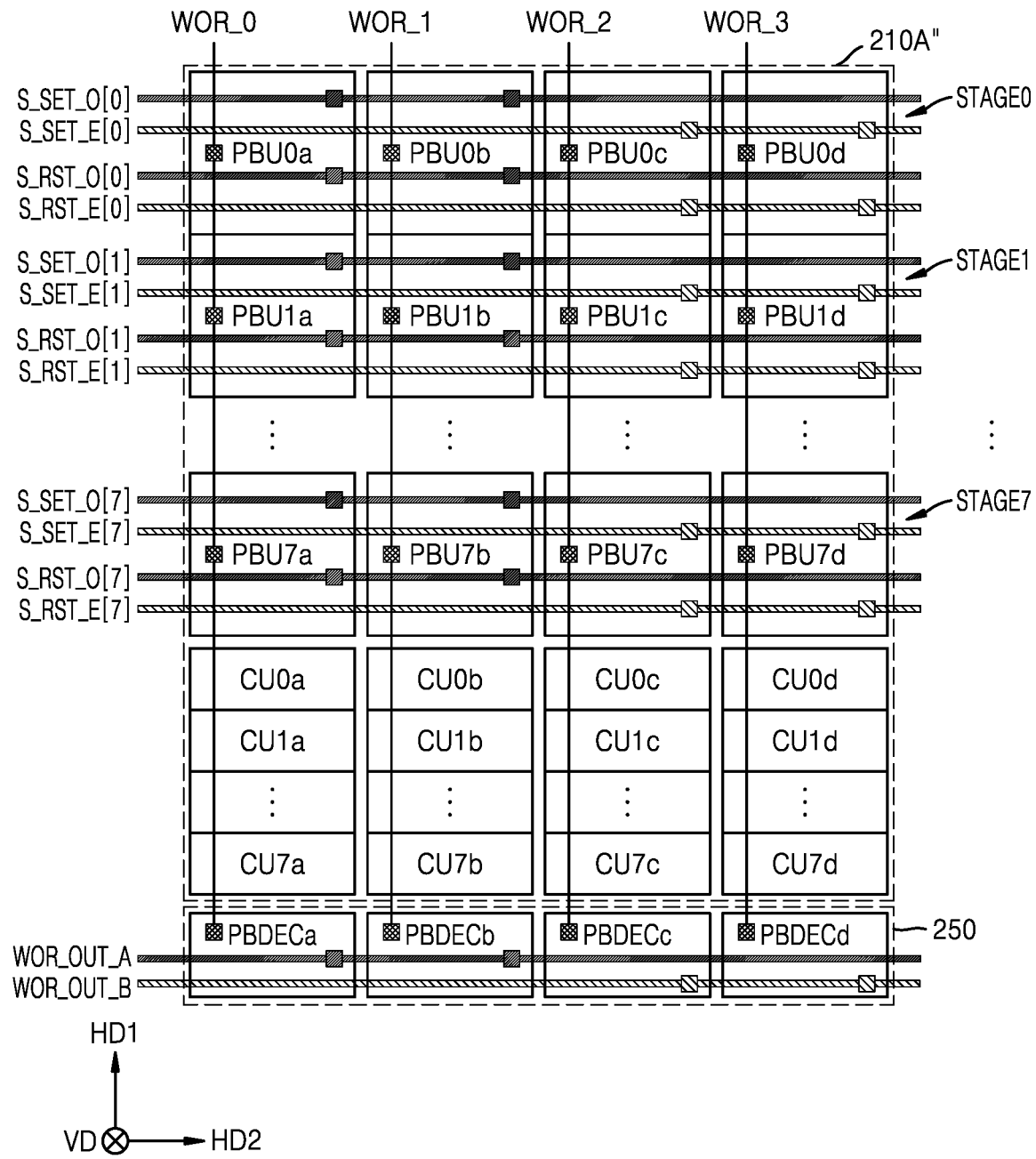

FIG. 18 exemplarily illustrates signal lines arranged above a page buffer circuit 210A", according to an embodiment of the inventive concept. Referring to FIG. 18, the page buffer circuit 210A" may correspond to an example of the page buffer circuit 210A' of FIG. 17. According to the present embodiment, each page buffer unit included in the page buffer circuit 210A" may correspond to the page buffer unit 101 in FIG. 10. Wired OR terminal WOR_0 connected in parallel to each of the page buffer units PBU0a through PBU7a, wired OR terminal WOR_1 connected in parallel to each of the page buffer units PBU0b through PBU7b, wired OR terminal WOR_2 connected in parallel to each of the page buffer units PBU0c through PBU7c, and wired OR terminal WOR_3 connected in parallel to each of the page buffer units PBU0d through PBU7d may be arranged above the page buffer circuit 210A" and the page buffer decoder 250 in the vertical direction VD, extend in the first horizontal direction HD1, and be apart from each other in the second horizontal direction HD2.

Figure 19:
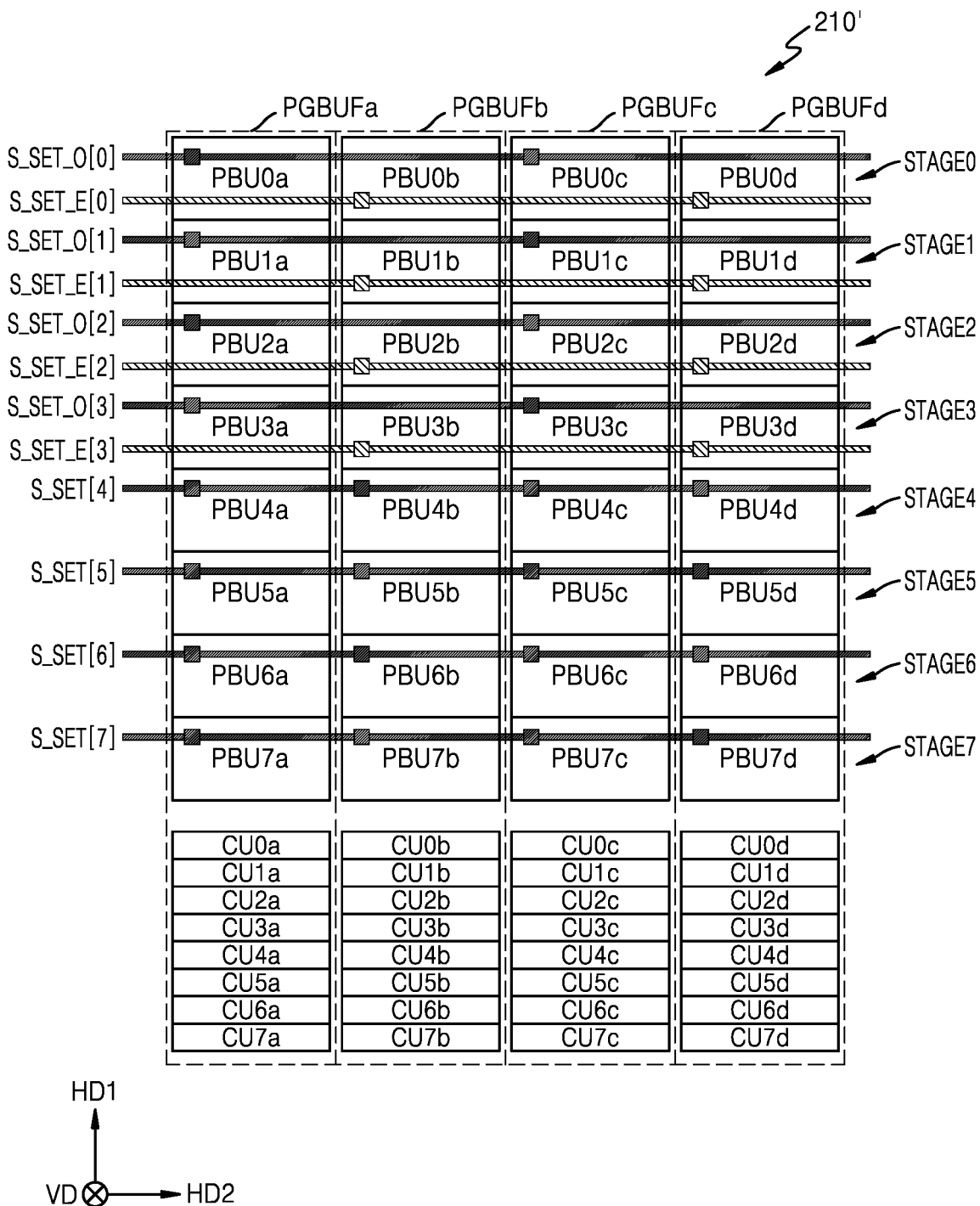
FIG. 19 illustrates a page buffer circuit according to an embodiment of the inventive concept.

FIG. 19 illustrates a page buffer circuit 210' according to an embodiment of the inventive concept.

Referring to FIG. 19, in the page buffer circuit 210', the EOS operation may be applied to the first through fourth stages STAGE0 through STAGE3, but may not be applied to the fifth through eighth stages STAGE4 through STAGE7. However, the inventive concept is not limited thereto, and the EOS operation may be applied to at least one of the first through eighth stages STAGE0 through STAGE7, while the EOS operation may not be applied to the other stages. In this case, in the first through fourth stages STAGE0 through STAGE3, odd-numbered page buffer units may be divided into the first group, and even-numbered page buffer units may be divided into the second group.

In the first stage STAGE0, the first set signal line S_SET_O[0] and the first reset signal line S_RST_O[0] may be connected to the page buffer units PBU0a and PBU0c of the first group, and the second set signal line S_SET_E[0] and the second reset signal line S_RST_E[0] may be connected to the page buffer units PBU0b and PBU0d of the second group. In the second stage STAGE1, the first set signal line S_SET_O[1] and the first reset signal line S_RST_O[1] may be connected to the page buffer units PBU1a and PBU1c of the first group, and the second set signal line S_SET_E[1] and the second reset signal line S_RST_E[1] may be connected to the page buffer units PBU1b and PBU1d of the second group. In this manner, according to the EOS method, in the first through fourth stages STAGE0 through STAGE3, odd-numbered page buffer units and even-numbered page buffer units may perform sensing operations by using different sensing signals from each other.

Figure 20:
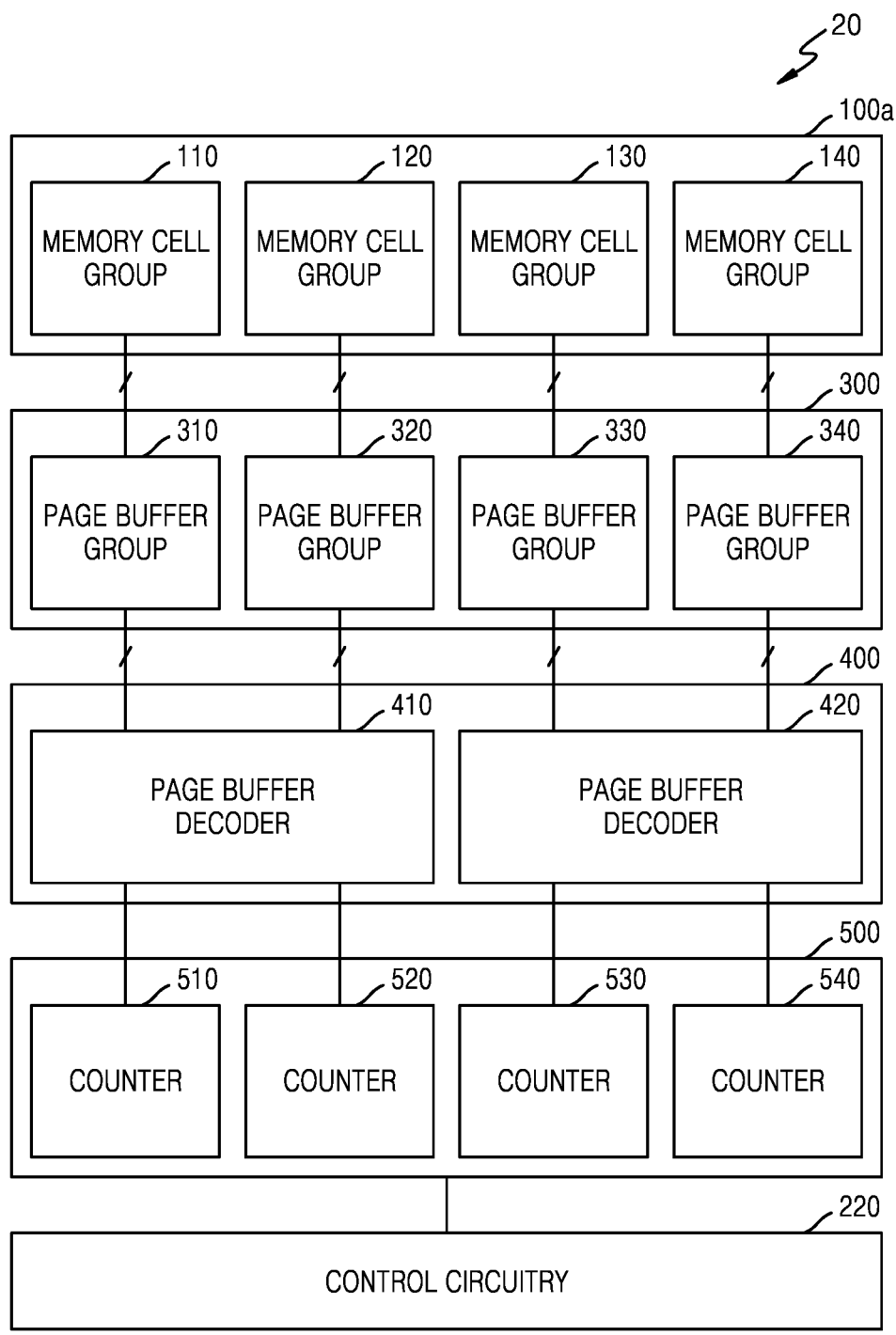
FIG. 20 illustrates a memory device according to an embodiment of the inventive concept.

FIG. 20 illustrates a memory device 20 according to an embodiment of the inventive concept.

Referring to FIG. 20, the memory device 20 may include a memory cell array 100a, a page buffer circuit 300, a page buffer decoder 400, a counting circuit 500, and the control circuitry 220. The memory device 20 may correspond to a modified example of the memory device 10 of FIG. 1, and descriptions given with reference to FIGS. 1 through 19 may also be applied to the present embodiment. The memory cell array 100a may include first through fourth memory cell groups 110 through 140. For example, the first through fourth memory cell groups 110 through 140 may be classified according to column addresses.

The page buffer circuit 300 may include first through fourth page buffer groups 310 through 340. For example, each of the first through fourth page buffer groups 310 through 340 may be implemented as the page buffer circuit 210 of FIG. 12, the page buffer circuit 210A of FIG. 15, the page buffer circuit 210A' of FIG. 16, the page buffer circuit 210A" of FIG. 18, or the page buffer circuit 210' of FIG. 19. The page buffer decoder 400 may include a first page buffer decoder 410 and a second page buffer decoder 420. The first page buffer decoder 410 may be connected to the first and second page buffer groups 310 and 320, and the second page buffer decoder 420 may be connected to the third and fourth page buffer groups 330 and 340.

The counting circuit 500 may include first through fourth counters 510 through 540. The first counter 510 may be connected to the first page buffer decoder 410 and count the number of memory cells corresponding to the first group, and the second counter 520 may be connected to the first page buffer decoder 410 and count the number of memory cells connected to the second group. The third counter 530 may be connected to the second page buffer decoder 420 and count a first number of the memory cells corresponding to the first group, and the fourth counter 540 may be connected to the second page buffer decoder 420 and count a second number of the memory cells connected to the second group. The control circuitry 220 may receive from the counting circuit 500 the counting result CNT corresponding to the first number of memory cells corresponding to the first group and the second number of memory cells corresponding to the second group, and by comparing the first number to the second number, the control circuitry 220 may perform the valley search operation OVS on the threshold voltage distribution of the memory cells.

Figure 21:
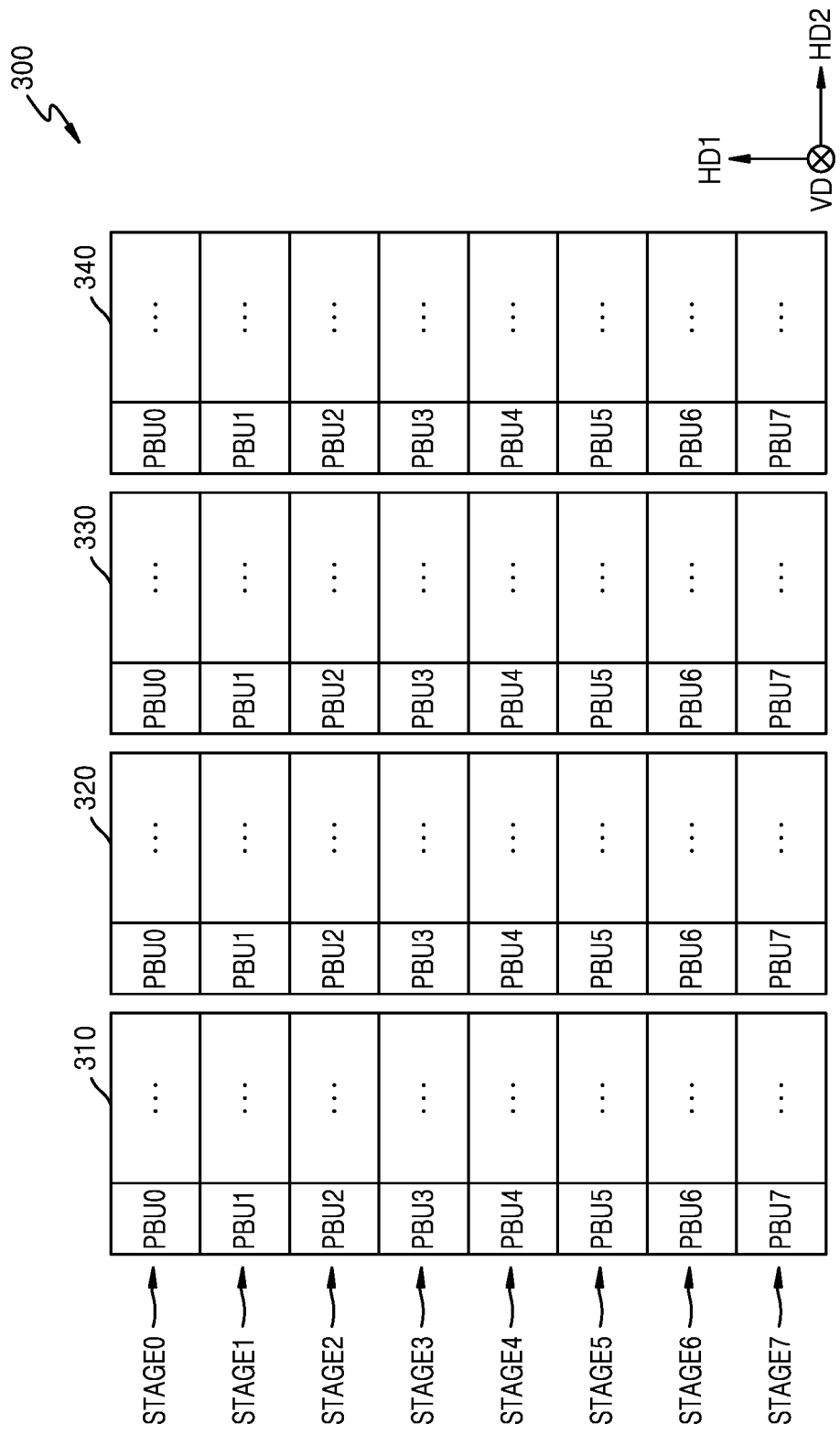
FIG. 21 exemplarily illustrates a page buffer circuit in FIG. 20 in detail, according to an embodiment of the inventive concept.

FIG. 21 exemplarily illustrates the page buffer circuit 300 in FIG. 20 in detail, according to an embodiment of the inventive concept.

Referring to FIG. 21, each of the first through fourth page buffer groups 310 through 340 may include a plurality of page buffer units that are arranged in a matrix structure including a plurality of columns and a plurality of rows. For example, the first through fourth page buffer groups 310 through 340 may be connected to bit lines BL arranged in the second horizontal direction HD2.

For example, each of the first through fourth page buffer groups 310 through 340 may have an eight-stage structure. For example, two sensing signal lines to which two different sensing signals are respectively applied may be arranged above each of the first through fourth stages STAGE0 through STAGE3, and a sensing signal line to which the same sensing signal is applied may be arranged above each of the fifth through eighth stages STAGE4 through STAGE7. However, the inventive concept is not limited thereto, and two sensing signal lines may be arranged above at least one of the first through eighth stages STAGE0 through STAGE7, and one sensing signal line may be arranged above each of the other stages. In the first stage STAGE0, each of the first through fourth page buffer groups 310 through 340 may include a plurality of page buffer units PBU0.

Hereinafter, descriptions are given with reference to FIGS. 13 and 21 together. For example, the first stage STAGE0 and the fifth stage STAGE4 may be selected according to the column address Y-ADDR. In the first development period SODEV1 and the first sensing period SEN1 of the pre-sensing period P_SEN, the first sensing operation SEN_O and the second sensing operation SEN_E may be performed on the first state STAGE0 by using the first and second development time periods DT1 and DT2, which are different, and in the sensing node re-precharge period SOREPRECH, a first counting operation MBC_O counting the first number of the memory cells included in the first threshold voltage region from the result of first sensing operation SEN_O and a second counting operation MBC_E counting the second number of the memory cells included in the second threshold voltage region from the result of second sensing operation SEN_E, and the OVS operation according to the first and second counting operations MBC_O and MBC_E may be performed. Subsequently, according to the result of the OVS operation, in the second development period SODEV2 and the second sensing period SEN2, sensing operations on the first stage STAGE0 and the fifth stage STAGE4 may be performed.

For example, when the second stage STAGE1 and the sixth stage STAGE5 are selected according to the column address Y-ADDR, the OVS operation may be performed for the second stage STAGE1 by using the EOS, and according to the result of the OVS, sensing operations for the second stage STAGE1 and the sixth stage STAGE5 may be performed. For example, when the third stage STAGE2 and the seventh stage STAGE6 are selected according to the column address Y-ADDR, the OVS operation may be performed for the third stage STAGE2 by using the EOS, and according to the result of the OVS, sensing operations for the third stage STAGE2 and the seventh stage STAGE6 may be performed. For example, when the fourth stage STAGE3 and the eighth stage STAGE7 are selected according to the column address Y-ADDR, the OVS operation may be performed for the fourth stage STAGE3 by using the EOS, and according to the result of the OVS, sensing operations for the fourth stage STAGE3 and the eighth stage STAGE7 may be performed.

Figure 22:
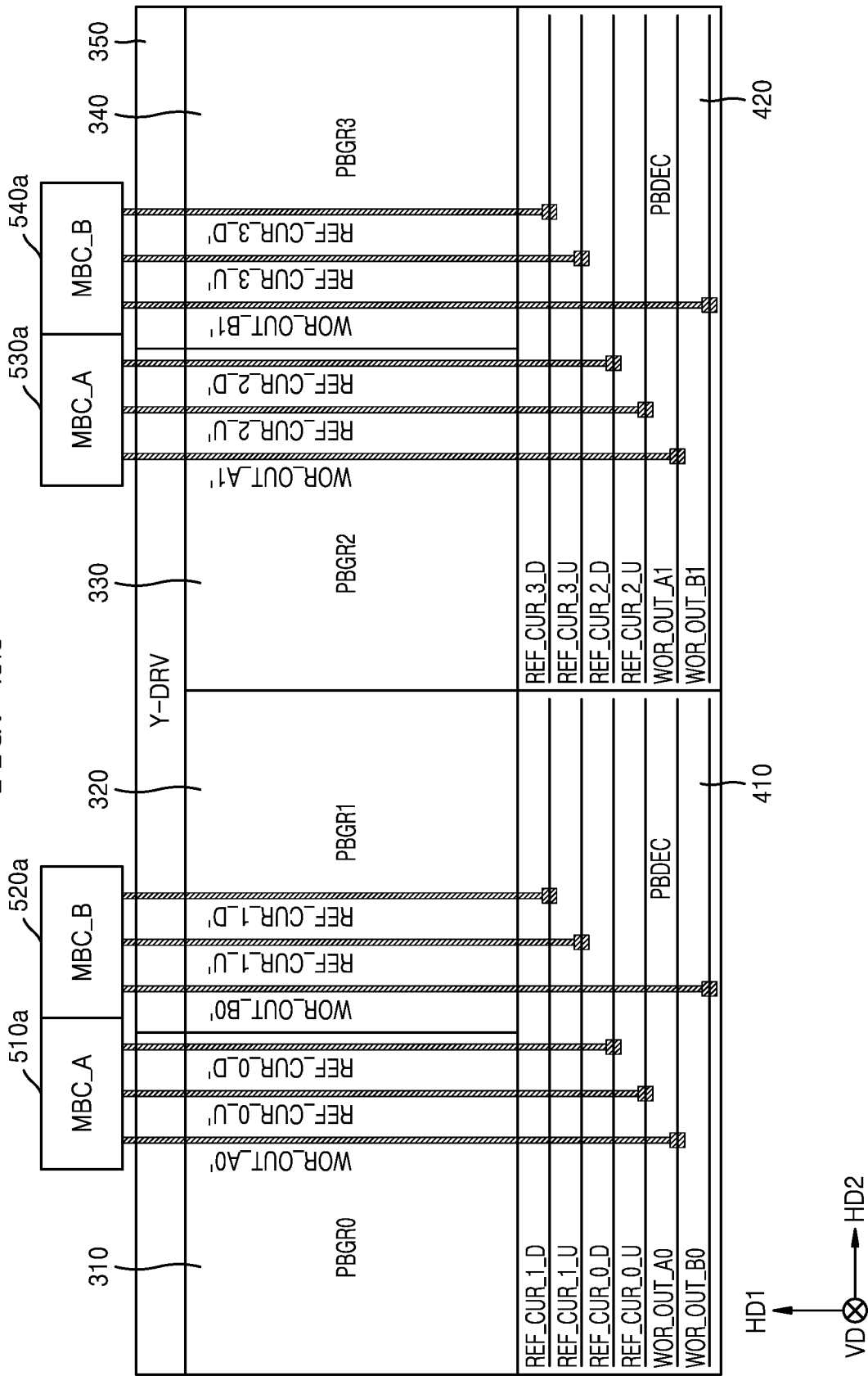
FIG. 22 exemplarily illustrates a connection relationship between first through fourth page buffer groups, first and second page buffer decoders, and first through fourth mass bit counters, according to an embodiment of the inventive concept.

FIG. 22 exemplarily illustrates a connection relationship between the first through fourth page buffer groups 310 through 340, the first and second page buffer decoders 410 and 420, and first through fourth mass bit counters 510*a* through 510*d*, according to an embodiment of the inventive concept. The first through fourth mass bit counters 510*a* through 510*d* may correspond to examples of the first through fourth counters 510 through 540 in FIG. 20.

Referring to FIG. 22, the first through fourth page buffer groups 310 through 340 may be arranged adjacent to each other in the second horizontal direction HD2. The first through fourth page buffer groups 310 through 340 may be connected to a column driver 350. The first and second page buffer decoders 410 and 420 may be arranged adjacent to each other in the second horizontal direction HD2. The first page buffer decoder 410 may be adjacent to the first and second page buffer groups 310 and 320 in the first horizontal direction HD1, and the second page buffer decoder 420 may be adjacent to the third and fourth page buffer groups 330 and 340 in the first horizontal direction HD1.

Reference current signal lines REF_CUR_0_D, REF_CUR_0_U, REF_CUR_1_D, and REF_CUR_1_U, and wired OR output lines WOR_OUT_A0 and WOR_OUT_B0 may be above the first page buffer decoder 410 in the vertical direction VD, and extend in the second horizontal direction HD2. Reference current signal lines REF_CUR_2_D, REF_CUR_2_U, REF_CUR_3_D, and REF_CUR_3_U, and wired OR output lines WOR_OUT_A0 and WOR_OUT_B0 may be above the second page buffer decoder 420 in the vertical direction VD, and extend in the second horizontal direction HD2.

Reference current signal lines REF_CUR_0_D' and REF_CUR_0_U', and wired OR output line WOR_OUT_A0' may be above the first and second page buffer groups 310 and 320 and the first page buffer decoder 410 in the vertical direction VD, extend in the first horizontal direction HD1, and connect the first page buffer decoder 410 to the first mass bit counter 510*a*. Reference current signal lines REF_CUR_1_D' and REF_CUR_1_U', and wired OR output line WOR_OUT_B0' may be above the first and second page buffer groups 310 and 320 and the first page buffer decoder 410 in the vertical direction VD, extend in the first horizontal direction HD1, and connect the first page buffer decoder 410 to the second mass bit counter 520*a*.

Reference current signal lines REF_CUR_2_D' and REF_CUR_2_U', and wired OR output line WOR_OUT_A1' may be above the third and fourth page buffer groups 330 and 340 and the second page buffer decoder 420 in the vertical direction VD, extend in the first horizontal direction HD1, and connect the second page buffer decoder 420 to the third mass bit counter 530*a*. Reference current signal lines REF_CUR_3_D' and REF_CUR_3_U', and wired OR output line WOR_OUT_B1' may be above the third and fourth page buffer groups 330 and 340 and the second page buffer decoder 420 in the vertical direction VD, extend in the first horizontal direction HD1, and connect the second page buffer decoder 420 to the fourth mass bit counter 540*a*.

Figure 23:
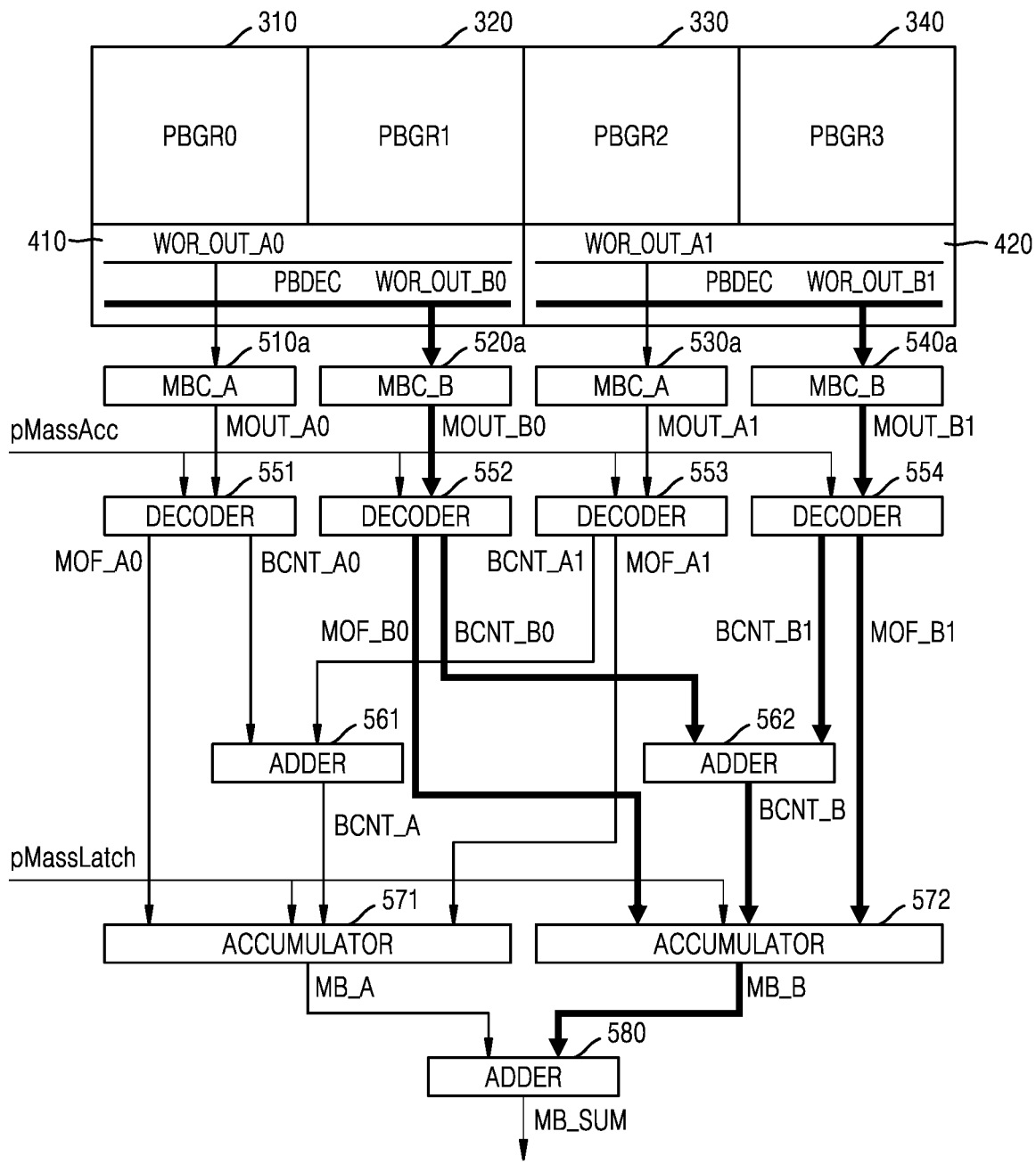
FIG. 23 illustrates in more detail first through fourth page buffer groups, first and second page buffer decoders, and first through fourth mass bit counters, according to an embodiment of the inventive concept.

FIG. 23 illustrates in more detail the first through fourth page buffer groups 310 through 340, the first and second page buffer decoders 410 and 420, and the first through fourth mass bit counters 510*a* through 510*d*, according to an embodiment of the inventive concept.

Referring to FIG. 23, the first page buffer decoder 410 may generate a first current corresponding to the number of memory cells included in the first threshold voltage region from the page buffer units of the first group included in the first and second buffer groups 310 and 320, and provide the generated first current to the wired OR output line WOR_OUT_A0. In addition, the first page buffer decoder 410 may generate a second current corresponding to the number of memory cells included in the second threshold voltage region from the page buffer units of the second group included in the first and second buffer groups 310 and 320, and provide the generated second current to the wired OR output line WOR_OUT_B0. The first mass bit counter 510*a* may generate a first digital output signal MOUT_A0 from the first current received via the wired OR output line WOR_OUT_A0, and the second mass bit counter 520*a* may generate a second digital output signal MOUT_B0 from the second current received via the wired OR output line WOR_OUT_B0.

The second page buffer decoder 420 may generate a third current corresponding to the number of memory cells included in the first threshold voltage region from the page buffer units of the first group included in the third and fourth buffer groups 330 and 340, and provide the generated third current to the wired OR output line WOR_OUT_A1. In addition, the second page buffer decoder 420 may generate a fourth current corresponding to the number of memory cells included in the second threshold voltage region from the page buffer units of the second group included in the third and fourth buffer groups 330 and 340, and provide the generated fourth current to the wired OR output line WOR_OUT_B1. The third mass bit counter 530*a* may generate a third digital output signal MOUT_A1 from the third current received via the wired OR output line WOR_OUT_A1, and the fourth mass bit counter 540*a* may generate a fourth digital output signal MOUT_B1 from the fourth current received via the wired OR output line WOR_OUT_B1.

Figure 24:
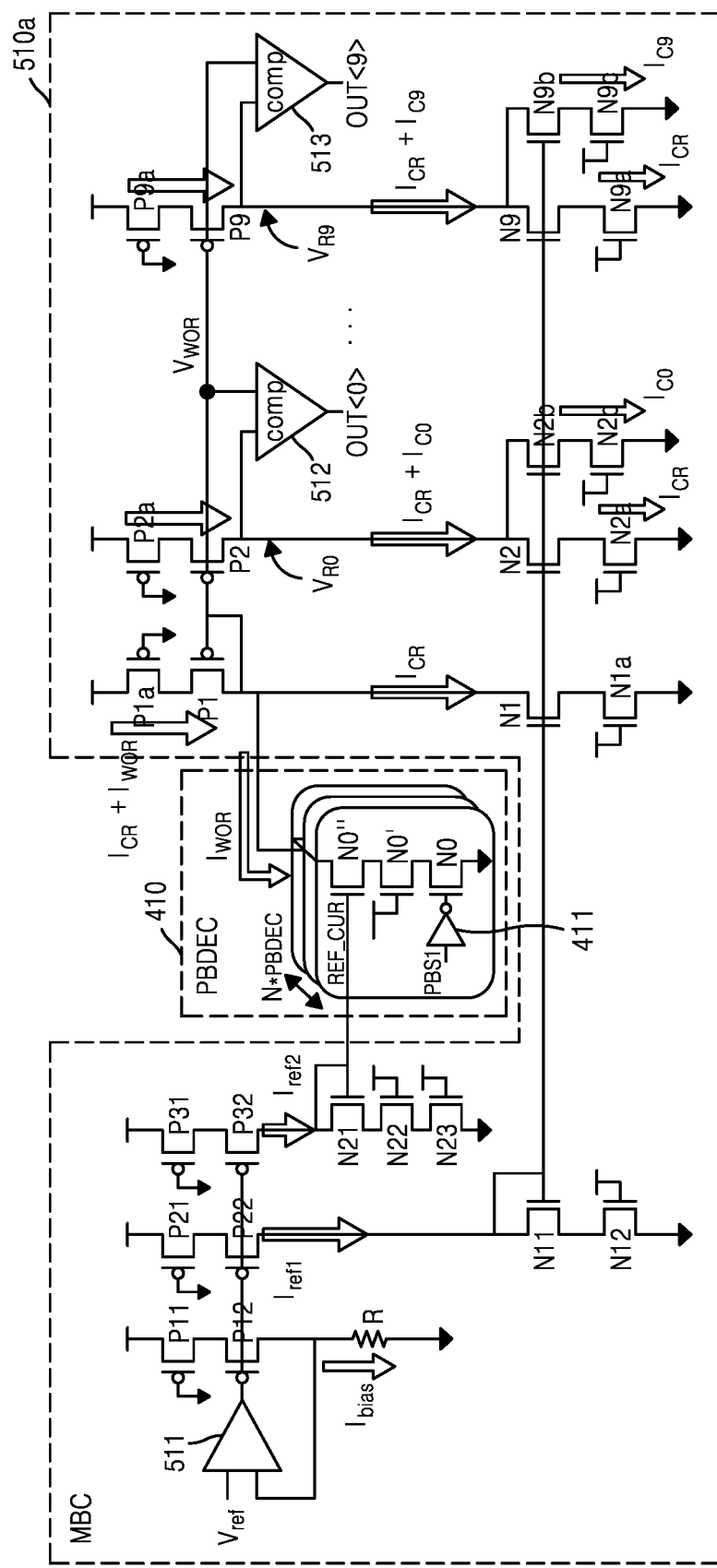
FIG. 24 exemplarily illustrates a first page buffer decoder and a first mass bit counter, according to an embodiment of the inventive concept.

FIG. 24 illustrates the first page buffer decoder 410 and the first mass bit counter 510*a*, according to an embodiment of the inventive concept.

Referring to FIGS. 23 and 24 together, the first page buffer decoder 410 may include N page buffer decoders. For example, the N page buffer decoders may include the first and second page buffer decoders PBDECa and PBDECb in FIG. 6. In this case, the N may be a positive integer, and may correspond to the number of columns of the first group included in the first and second page buffer groups 310 and 320. For example, the first page buffer decoder 410 may include an inverter 411 and the transistors N0, N0', and N0", and the transistor N0' may be referred to as a column enable transistor. For example, a page buffer signal PBS1 input to the inverter 411 may correspond to the first or second page buffer signals PBSa and PBSb in FIG. 6. The first mass bit counter 510*a* may be connected to the wired OR output line WOR_OUT_A0 connected to the N page buffer decoders.

The first mass bit counter 510*a* may generate, from a current signal $I_{WOR}$, a first digital output signal MOUT_A0 corresponding to the number of fail bits, for example, OUT<0> through OUT<9>. The first mass bit counter 510*a* may include a plurality of transistors P11, P12, P21, P22, P31, P32, N11, N12, N21, N22, and N23 constituting a reference current generator, a resistor R, and a differential amplifier 511. In addition, the first mass bit counter 510*a* may further include transistors P1, P1*a*, P2, P2*a*, P9, P9*a*, N1, N1*a*, N2, N2*a*, N2*b*, N2*c*, N9, N9*a*, N9*b*, and N9*c* constituting a counting unit, and a plurality of comparators 512 and 513. In an embodiment, in a period in which an operation of the first mass bit counter 510*a* is enabled, the transistors P11, P21, P31, N12, N23, P1*a*, P2*a*, P9*a*, N1*a*, N2*a*, N2*c*, N9*a*, and N9*c* may be turned on. In an embodiment, in a period in which the operation of the first mass bit counter 510a is disabled, the transistors P11, P21, P31, N12, N23, P1a, P2a, P9a, N1a, N2a, N2c, N9a, and N9c may be turned off.

A reference voltage Vref may be input to a first input terminal of the differential amplifier 511, and a voltage across the resistor R may be input to a second input terminal. The transistors P11 and P12 and the resistor R may constitute a feedback variable resistor unit, and a bias current Ibias may flow through the resistor R. The transistors P21, P22, N11, and N12 may constitute a first reference current generator that generates a first reference current Iref1, and the transistors P31, P32, N21, N22, and N23 may constitute a second reference current generator that generates a second reference current Iref2. A node voltage between the transistors P32 and N21 in the second reference current generator may be provided as a reference current signal REF_CUR to the first page buffer decoder 410.

Figure 25:
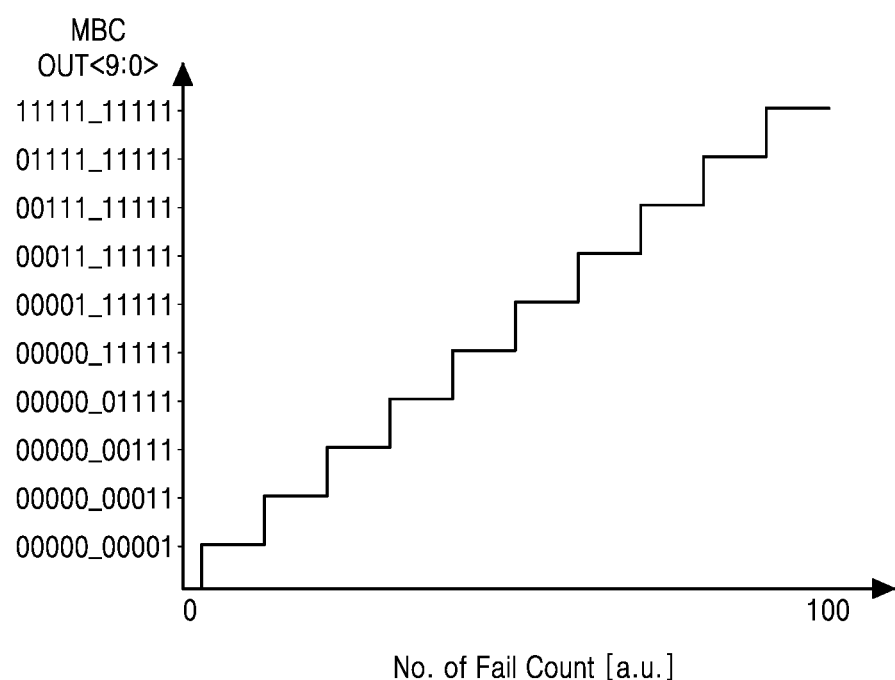
FIG. 25 is an example graph of a digital output signal of a mass bit counter, according to an embodiment of the inventive concept.

FIG. 25 is a graph exemplarily illustrating a digital output signal OUT<9:0> of the first mass bit counter 510a, according to an embodiment of the inventive concept.

Referring to FIGS. 23 through 25 together, the transistors P1 and P2 may constitute a current mirror, and a current flowing through the transistor P1 may correspond to a sum of the current signal $I_{WOR}$ flowing through the wired OR output line WOR_OUT_A0 and a current signal $I_{CR}$ flowing through the transistor N1. The comparator 512 may output a comparison result OUT<0>, by comparing a voltage $V_{WOR}$ of the wired OR output line WOR_OUT_A0 to a node voltage $V_{R0}$ between the transistors P2 and N2. The comparator 513 may output a comparison result OUT<9>, by comparing the voltage $V_{WOR}$ of the wired OR output line WOR_OUT_A0 to a node voltage $V_{R9}$ between the transistors P9 and N9. As the number of fail counts increases, the digital output signals OUT<9:0> of the first mass bit counter 510a may increase. In this manner, the first mass bit counter 510a may use the comparators 512 and 513, and generate the digital output signal OUT<9:0> from the current signal $I_{WOR}$ output from the first page buffer decoder 410.

Referring again to FIG. 23, the first through fourth mass bit counters 510a through 510d may generate first through fourth digital output signals MOUT_A0 through MOUT_B1, respectively, and may provide the generated first through fourth digital output signals MOUT_A0, MOUT_B0, MOUT_A1, and MOUT_B1 to the first through fourth decoders 551 through 554, respectively. The first through fourth decoders 551 through 554 may be enabled according to a first control signal pMassAcc, decode the first through fourth digital output signals MOUT_A0, MOUT_B0, MOUT_A1, and MOUT_B1, respectively, and generate first through fourth bit count outputs BCNT_A0, BCNT_B0, BCNT_A1, BCNT_B1 and first through fourth overflows MOF_A0, MOF_B0, MOF_A1, and MOF_B1, respectively. The first decoder 551 may decode the first digital output signal MOUT_A0, and output the first bit count output BCNT_A0 and the first overflow MOF_A0. For example, the first digital output signal MOUT_A0 may include a 10-bit signal, and the first bit count output BCNT_A0 may include a 5-bit signal.

A first adder 561 may generate a first sum signal BCNT_A by summing the first and third bit count outputs BCNT_A0 and BCNT_A1. A second adder 562 may generate a second sum signal BCNT_B by summing the second and fourth bit count outputs BCNT_B0 and BCNT_B1. For example, each of the first and second sum signals BCNT_A and BCNT_B may include a 6-bit signal. A first accumulator 571 may be enabled according to a second control signal pMassLatch, and by accumulating the first sum signal BCNT_A and the first and third overflows MOF_A0 and MOF_A1, may generate a first mass bit output signal MB_A. A second accumulator 572 may be enabled according to a second control signal pMassLatch, and by accumulating the second sum signal BCNT_B and the second and fourth overflows MOF_B0 and MOF_AB, may generate a second mass bit output signal MB_B. A third adder 580 may generate a mass bit sum signal MB_SUM by summing the first and second mass bit output signals MB_A and MB_B. For example, each of the first and second mass bit output signals MB_A and MB_B and the mass bit sum signal MB_SUM may include an 11-bit signal.

In this case, the first mass bit output signal MB_A may correspond to the first number of memory cells included in the first threshold voltage region (for example, a region between the first voltage level V1 and the second voltage level V2 in FIG. 14) obtained from the result of the first sensing operation (for example, SEN_O in FIG. 13). In this case, the second mass bit output signal MB_B may correspond to the second number of memory cells included in the second threshold voltage region (for example, a region between the second voltage level V2 and the third voltage level V3 in FIG. 14) obtained from the result of the second sensing operation (for example, SEN_E in FIG. 13). The first through fourth mass bit counters 510a through 510d, the first through fourth decoders 551 through 554, the first through third adders 561, 562, and 580, and the first and second accumulators 571 and 572 may constitute the counting circuit 500 of FIG. 20. Accordingly, a control circuitry may perform a valley search operation on a threshold voltage distribution of the memory cells by comparing the first mass bit output signal MB_A to the second mass bit output signal MB_B, and may change a next development time period for the page buffer units according to a result of the valley search operation.

Figure 26:
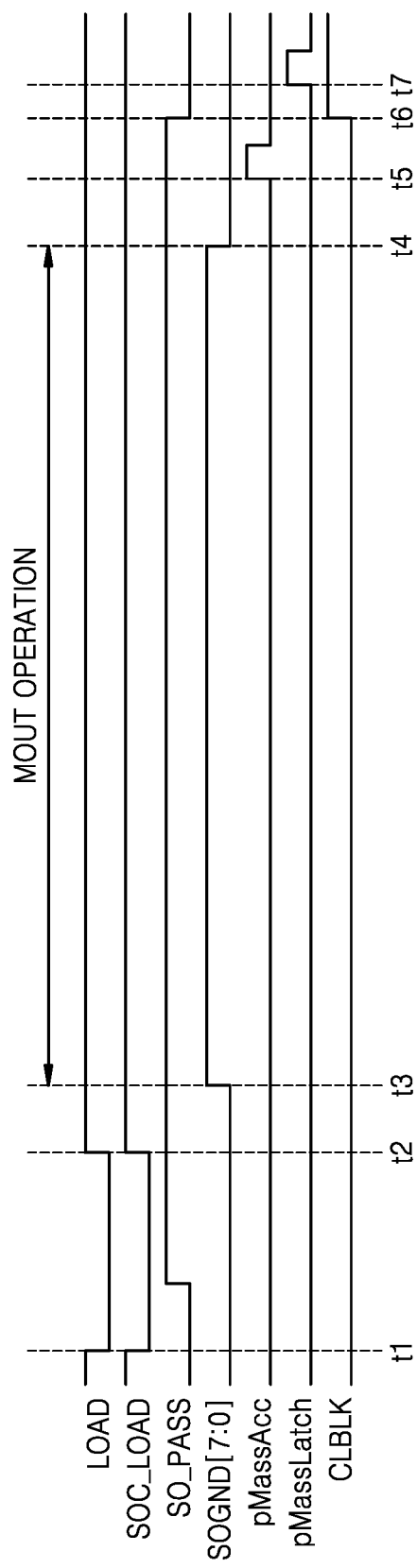
FIG. 26 is a timing diagram of a read operation of a memory device, according to an embodiment of the inventive concept.

FIG. 26 is a timing diagram of a read operation of a memory device, according to an embodiment of the inventive concept. Referring to FIGS. 9, 23, and 26 together, in a time interval t1 to t2, the load signals LOAD and SOC_LOAD may have a logic low level, and accordingly, the sensing nodes and the combined sensing node may be precharged. In a time period from t3 to t4, the ground control signal SOGND may have a logic high level, and the mass bit counters may perform the counting operation. When the first and second counting operations on the first and second sensing results corresponding to different stages from each other are sequentially performed, respectively, the period of t1 to t4 may be performed twice, but according to embodiments of the inventive concept, because the first and second counting operations on the first and second sensing results corresponding to the same stage are simultaneously performed, the time required for the first and second counting operations, that is, the mass bit counting MOUT operation, may be reduced compared to the related art.

In addition, according to the present embodiment, the ground control signal SOGND may be disabled at the time point t4, and the bit line connection control signal CLBLK may be enabled at a time point t6. In this manner, by controlling the ground control signal SOGND and the bit line connection control signal CLBLK not to be enabled at the same time, it may be possible to prevent a short path from being formed from the bit line to the ground terminal. At a time point t5, a first control signal pMassAcc may have a logic high level, and a decoding operation on the mass bit counting result may be performed. At a time point t6, the bit line connection control signal CLBLK may have a logic high level, and at a time point t7, a second control signal pPassLatch may have a logic high level, and an accumulation operation on a decoding result may be performed.

Figure 27:
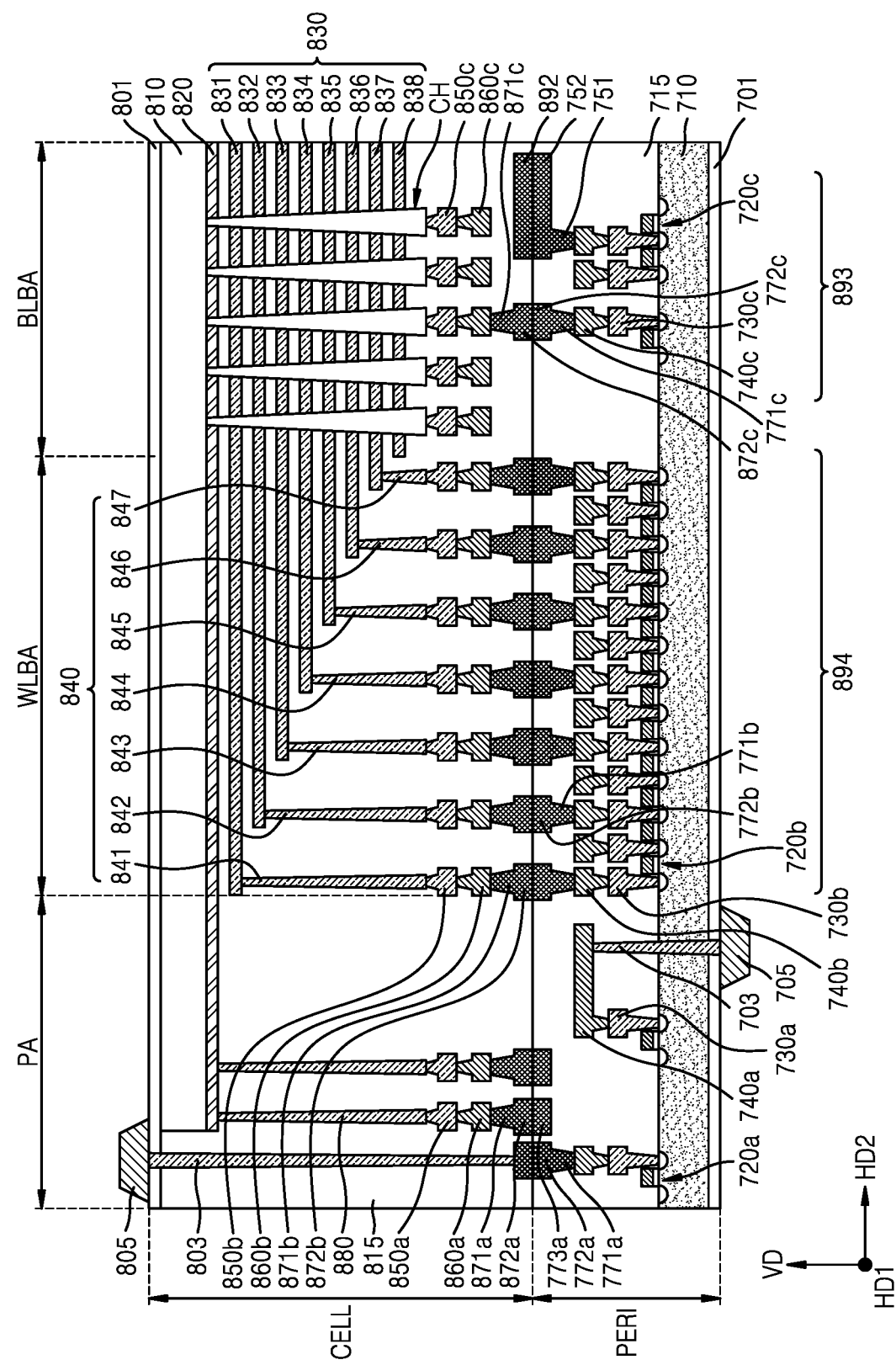
FIG. 27 is a cross-sectional view of a memory device according to an embodiment of the inventive concept.

FIG. 27 is a cross-sectional view of a memory device 900 according to an embodiment of the inventive concept.

Referring to FIG. 27, the memory device 900 may include a chip to chip (C2C) structure. The C2C structure may mean a structure in which, after an upper chip including a cell region CELL is manufactured on a first wafer, and a lower chip including a peripheral circuit region PERI is manufactured on a second wafer different from the first wafer, the upper chip and the lower chip are connected to each other by using a bonding method. For example, the bonding method may mean a method of electrically connecting a bonding metal formed on an uppermost metal layer of an upper chip to a bonding metal formed on an uppermost metal layer of a lower chip. For example, when the bonding metal includes copper (Cu), the bonding method may be a Cu—Cu bonding method, and the bonding metal may also include aluminum or tungsten. The embodiments illustrated in FIGS. 1 through 26 may be implemented in the memory device 900, and for example, the page buffer circuit described above with reference to FIGS. 1 through 26 may be arranged in the peripheral circuit region PERI.

Each of the peripheral circuit region PERI and the cell region CELL of the memory device 900 may include an external pad bonding area PA, a word line bonding area WLBA, and a bit line bonding area BLBA. The peripheral circuit region PERI may include a first substrate 710, an interlayer insulating layer 715, a plurality of circuit elements 720*a*, 720*b*, and 720*c* formed on the first substrate 710, and first metal layers 730*a*, 730*b*, and 730*c* connected to a plurality of circuit elements 720*a*, 720*b*, and 720*c*, respectively, and second metal layers 740*a*, 740*b*, and 740*c* formed on the first metal layers 730*a*, 730*b*, and 730*c*, respectively. Each of the circuit elements 720*a*, 720*b*, and 720*c* may include one or more transistors. In an embodiment, the first metal layers 730*a*, 730*b*, and 730*c* may include tungsten having relatively high resistance, and the second metal layers 740*a*, 740*b*, and 740*c* may include Cu having relatively low resistance.

In the present specification, only the first metal layers 730*a*, 730*b*, and 730*c* and the second metal layers 740*a*, 740*b*, and 740*c* are illustrated and described, but the invention is not limited thereto, and at least one or more metal layers may be further formed on the second metal layers 740*a*, 740*b*, and 740*c*. At least some of the one or more metal layers formed on the second metal layers 740*a*, 740*b*, and 740*c* may include aluminum or the like having a lower resistance than Cu forming the second metal layers 740*a*, 740*b*, and 740*c*. The interlayer insulating layer 715 may be arranged on the first substrate 710 to cover the plurality of circuit elements 720*a*, 720*b*, and 720*c*, the first metal layers 730*a*, 730*b*, and 730*c*, and the second metal layers 740*a*, 740*b*, and 740*c*, and may include an insulating material such as silicon oxide and silicon nitride.

Lower bonding metals 771*b* and 772*b* may be formed on the second metal layer 740*b* in the word line bonding area WLBA. In the word line bonding area WLBA, the lower bonding metals 771*b* and 772*b* of the peripheral circuit region PERI may be electrically connected to upper bonding metals 871*b* and 872*b* of the cell region CELL by using a bonding method, and the lower bonding metals 771*b* and 772*b* and the upper bonding metals 871*b* and 872*b* may include aluminum, copper, tungsten, etc. The upper bonding metals 871*b* and 872*b* of the cell region CELL may be referred to as first metal pads, and the lower bonding metals 771*b* and 772*b* of the peripheral circuit region PERI may be referred to as second metal pads.

The cell region CELL may provide at least one memory block. The cell region CELL may include a second substrate 810 and a common source line 820. On the second substrate 810, a plurality of word lines 831 through 838, and 830 may be stacked in the vertical direction VD perpendicular to an upper surface of the second substrate 810. String select lines and ground select lines may be arranged on and under the word lines 830, and the word lines 830 may be arranged between the string select lines and the ground select line.

In the bit line bonding area BLBA, a channel structure CH may extend in a direction perpendicular to the upper surface of the second substrate 810, and penetrate the word lines 830, the string select lines, and the ground select line. The channel structure CH may include a data storage layer, a channel layer, and a filled insulating layer, and the channel layer may be electrically connected to a first metal layer 850*c* and a second metal layer 860*c*. For example, the first metal layer 850*c* may be a bit line contact, and the second metal layer 860*c* may be a bit line BL. In an embodiment, the second metal layer, that is, bit line 860*c* may extend in the first horizontal direction HD1 parallel with the upper surface of the second substrate 810. The channel structure CH may correspond to the pillar P in FIG. 4.

In the embodiment illustrated in FIG. 26, an area in which the channel structure CH and the second metal layer, that is, bit line 860*c* are arranged may be defined as the bit line bonding area BLBA. The second metal layer, that is, bit line 860*c* may be electrically connected to the circuit elements 720*c* providing a page buffer 893 in the peripheral circuit region PERI in the bit line bonding area BLBA. For example, the second metal layer, that is, bit line 860*c* may be connected to upper bonding metals 871*c* and 872*c* in the peripheral circuit region PERI, and the upper bonding metals 871*c* and 872*c* may be respectively connected to lower bonding metals 771*c* and 772*c* connected to the circuit elements 720*c* of the page buffer 893. The page buffer 893 may be a portion of the page buffer circuit 210 in FIG. 1.

In the word line bonding area WLBA, the word lines 830 may extend in the second horizontal direction HD2 parallel with the upper surface of the second substrate 810, and may be connected to a plurality of cell contact plugs 841 through 847, and 840. The word lines 830 and the cell contact plugs 840 may be connected to each other by using pads that is provided by at some of the word lines 830 extending to different lengths from each other in the second horizontal direction HD2. A first metal layer 850*b* and a second metal layer 860*b* may be sequentially connected to an upper portion of the cell contact plugs 840 connected to the word lines 830. In the word line bonding area WLBA, the cell contact plugs 840 may be connected to the peripheral circuit region PERI via the upper bonding metals 871*b* and 872*b* of the cell region CELL and the lower bonding metals 871*b* and 872*b* of the peripheral circuit region PERI.

The cell contact plugs 840 may be electrically connected to the circuit elements 720*b* providing a row decoder 894 in the peripheral circuit region PERI. In an embodiment, an operating voltage of the circuit elements 720*b* providing the row decoder 894 may be different from an operating voltage of the circuit elements 720*c* providing the page buffer 893. For example, the operating voltage of the circuit elements 720*c* providing the page buffer 893 may be greater than the operating voltage of the circuit elements 720*b* providing the row decoder 894. The row decoder 894 may be a portion of the row decoder 240 in FIG. 1.

A common source line contact plug 880 may be arranged in the external pad bonding area PA. The common source line contact plug 880 may include a conductive material such as a metal, a metal compound, and polysilicon, and may be electrically connected to the common source line 820. A first metal layer 850*a* and a second metal layer 860*a* may be sequentially stacked on the common source line contact plug 880. For example, an area in which the common source line contact plug 880, the first metal layer 850*a*, and the second metal layer 860*a* are arranged may be defined as the external pad bonding area PA.

First and second input/output pads 705 and 805 may be arranged in the external pad bonding area PA. Referring to FIG. 27, a lower insulating layer 701 covering a lower surface of the first substrate 710 may be formed under the first substrate 710, and the first input/output pad 705 may be formed on the lower insulating layer 701. The first input/output pad 705 may be connected to at least one of the plurality of circuit elements 720*a*, 720*b*, and 720*c* in the peripheral circuit region PERI via a first input/output contact plug 703, and may be apart from the first substrate 710 by the lower insulating layer 701. In addition, a side insulating layer may be arranged between the first input/output contact plug 703 and the first substrate 710, and may electrically separate the first input/output contact plug 703 from the first substrate 710.

In an example embodiment, the memory device 900, such as described in FIG. 27, can operate and can include device components according to one or more of the example embodiments described in FIGS. 1 to 26 previously. In an example embodiment, the cell region CELL may correspond to the memory cell array 100 of FIG. 1 and the first semiconductor layer L1 of FIG. 2. In an example embodiment, the peripheral circuit region PERI may correspond to the peripheral circuit 200 of FIG. 1 and the second semiconductor layer L2 of FIG. 2.

Referring to FIG. 27, an upper insulating layer 801 covering an upper surface of the second substrate 810 may be formed on the second substrate 810, and the second input/output pad 805 may be formed on the upper insulating layer 801. The second input/output pad 805 may be connected to at least one of the plurality of circuit elements 720*a*, 720*b*, and 720*c* arranged in the peripheral circuit region PERI via the second input/output contact plug 803.

According to embodiments, the second substrate 810, the common source line 820, or the like may not be in an area where the second input/output contact plug 803 is arranged. In addition, the second input/output pad 805 may not overlap the word lines 830 in a third direction (Z-axis direction). Referring to FIG. 27, the second input/output contact plug 803 may be apart from the second substrate 810 in a direction parallel with the upper surface of the second substrate 810, and may be connected to the second input/output pad 805 by penetrating an interlayer insulating layer 815 of the cell region CELL.

According to embodiments, the first input/output pad 705 and the second input/output pad 805 may be selectively formed. For example, the memory device 800 may include only the first input/output pad 705 arranged on the first substrate 810, or may include only the second input/output pad 805 arranged on the second substrate 810. Alternatively, the memory device 800 may include both the first input/output pad 705 and the second input/output pad 805.

In each of the external pad bonding area PA and the bit line bonding area BLBA included in each of the cell region CELL and the peripheral circuit region PERI, there may be a metal pattern of the uppermost metal layer as a dummy pattern, or the uppermost metal layer may be empty.

In the external pad bonding area PA of the memory device 800, a lower metal pattern 773*a* having the same shape as an upper metal pattern 772*a* in the cell region CELL may be formed on the upper metal layer of the peripheral circuit region PERI, in response to the upper metal pattern 872*a* formed on the upper metal layer in the cell region CELL. The lower metal pattern 773*a* formed on the uppermost metal layer of the peripheral circuit region PERI may not be connected to a separate contact in the peripheral circuit region PERI. Similarly to this case, in response to the lower metal pattern formed on the uppermost metal layer of the peripheral circuit region PERI in the external pad bonding area PA, an upper metal pattern having the same shape as the lower metal pattern of the peripheral circuit region PERI may be formed on the upper metal layer of the cell region CELL.

Lower bonding metals 771*b* and 772*b* may be formed on the second metal layer 740*b* of the word line bonding area WLBA. In the word line bonding area WLBA, the lower bonding metals 771*b* and 772*b* of the peripheral circuit region PERI may be electrically connected to the upper bonding metals 871*b* and 872*b* of the cell region CELL by using the bonding method. In the bit line bonding area BLBA, in response to the lower metal pattern 752 formed on the uppermost metal layer of the peripheral circuit region PERI, an upper metal pattern 892 having the same shape as a lower metal pattern 752 of the peripheral circuit region PERI may be formed on the upper metal layer of the cell region CELL. A contact may not be formed on the upper metal pattern 892 that is formed on the uppermost metal layer of the cell region CELL.

Figure 28:
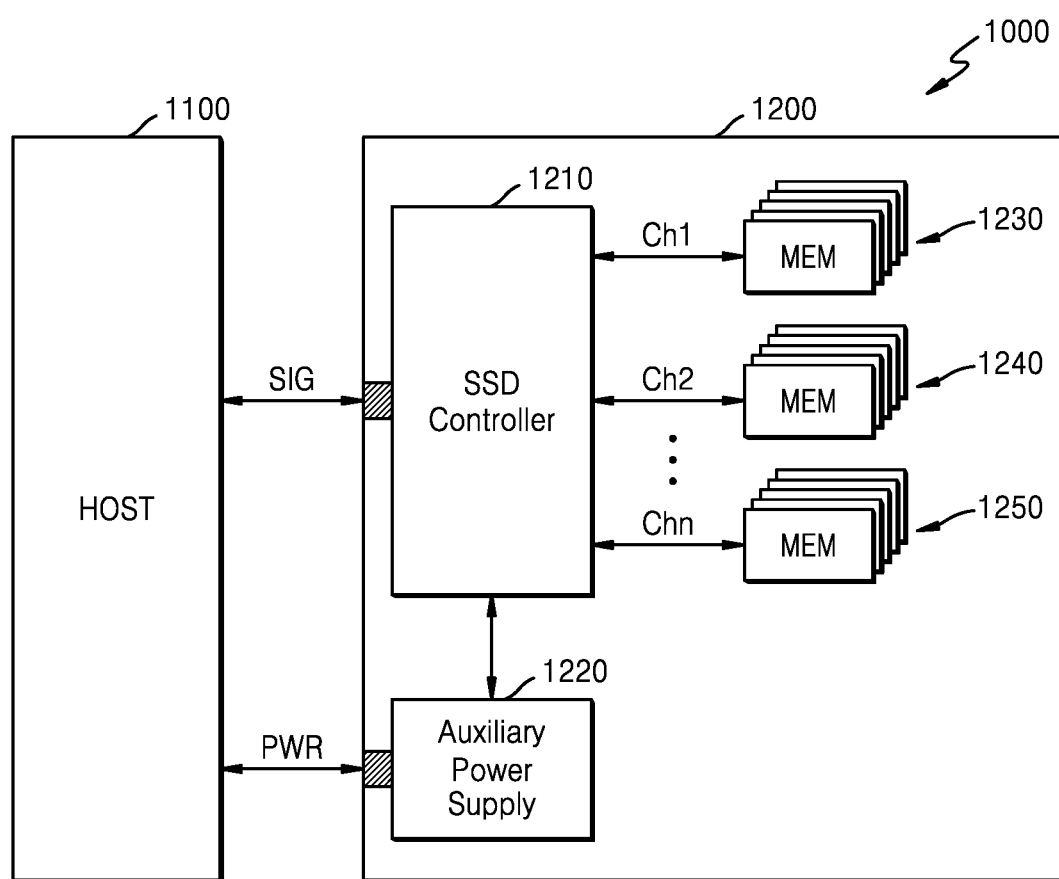
FIG. 28 is a block diagram of an example in which a memory device is applied to a solid state drive (SSD) system, according to some embodiment of the inventive concept.

FIG. 28 is a block diagram of an example in which a memory device is applied to a solid state drive (SSD) system, according to some embodiment of the inventive concept. Referring to FIG. 28, the SSD system 1000 may include a host 1100 and an SSD 1200. The SSD 1200 may include an SSD controller 1210, an auxiliary power supply 1220, and memory devices 1230, 1240, and 1250. The memory devices 1230, 1240, and 1250 may include vertically stacked NAND flash memory devices. In this case, the SSD 1200 may be implemented by using the embodiments described above with reference to FIGS. 1 through 27.

While the present disclosure has been particularly shown and described with reference to embodiments thereof, it will be understood that various changes in form and details may be made therein without departing from the spirit and scope of the following claims.

What is claimed is:

1. A memory device comprising:
   a memory cell array including a plurality of memory cell groups;
   a page buffer circuit including a plurality of page buffer groups respectively connected to the plurality of memory cell groups, wherein:
   each of the plurality of page buffer groups comprises a plurality of page buffer units arranged in a matrix form, and
   a plurality of first page buffer units in a first stage of each page buffer group are divided into a first group configured to perform a first sensing operation according to a first sensing signal and a second group configured to perform a second sensing operation according to a second sensing signal;
   a counting circuit configured to count a first number of memory cells included in a first threshold voltage region from a result of the first sensing operation, and count a second number of memory cells included in a second threshold voltage region from a result of the second sensing operation; and a control circuit configured to determine a development time period of the plurality of first page buffer units based on a comparison result of the first number of memory cells and the second number of memory cells, wherein the plurality of page buffer groups comprise a first page buffer group, a second page buffer group, a third page buffer group, and a fourth page buffer group, and wherein the memory device further comprises:

a first page buffer decoder configured to generate a first current corresponding to a number of memory cells included in the first threshold voltage region from page buffer units of the first group of the first and second page buffer groups, and generate a second current corresponding to a number of memory cells included in the second threshold voltage region from page buffer units of the second group of the first and second page buffer groups; and a second page buffer decoder configured to generate a third current corresponding to a number of memory cells included in the first threshold voltage region from page buffer units of the first group of the third and fourth page buffer groups, and generate a fourth current corresponding to a number of memory cells included in the second threshold voltage region from page buffer units of the second group of the third and fourth page buffer groups.

2. The memory device of claim 1, wherein the counting circuit comprises:

a first mass bit counter configured to generate a first digital output signal from the first current;

a second mass bit counter configured to generate a second digital output signal from the second current;

a third mass bit counter configured to generate a third digital output signal from the third current; and a fourth mass bit counter configured to generate a fourth digital output signal from the fourth current.

3. The memory device of claim 2, wherein the counting circuit further comprises:

a first decoder configured to generate a first bit count output and a first overflow from the first digital output signal;

a second decoder configured to generate a second bit count output and a second overflow from the second digital output signal;

a third decoder configured to generate a third bit count output and a third overflow from the third digital output signal; and a fourth decoder configured to generate a fourth bit count output and a fourth overflow from the fourth digital output signal.

4. The memory device of claim 3, wherein the counting circuit further comprises:

a first adder configured to generate a first sum signal corresponding to the first group, by adding the first and third bit count outputs; and a second adder configured to generate a second sum signal corresponding to the second group, by adding the second and fourth bit count outputs.

5. The memory device of claim 4, wherein the counting circuit further comprises:

a first accumulator configured to generate a first mass bit output signal corresponding to the first group from the first sum signal, the first overflow, and the third overflow; and a second accumulator configured to generate a second mass bit output signal corresponding to the second group from the second sum signal, the second overflow, and the fourth overflow.

6. The memory device of claim 1, wherein the control circuit is further configured to perform a valley search operation on a threshold voltage distribution of memory cells corresponding to the first and second groups by comparing the first number of memory cells to the second number of memory cells, wherein, in a first development period, first sensing nodes of each of page buffer units of the first group are developed during a first development time period, and second sensing nodes of each of page buffer units of the second group are developed during a second development time period different from the first development time period, and wherein, in a second development period after the first development period, the first and second sensing nodes are developed during a third development time period based on a result of the valley search operation.

7. The memory device of claim 1, wherein the first sensing signal is enabled at a first time point, and the second sensing signal is enabled at a second time point different from the first time point.

8. The memory device of claim 1, wherein each of page buffer units of the first group includes first sensing latches each configured to set or reset in response a first set signal and a first reset signal of the first sensing signal, respectively, and wherein each of page buffer units of the second group includes second sensing latches each configured to set or reset in response a second set signal and a second reset signal of the second sensing signal, respectively.

9. A memory device comprising:

a memory cell array including memory cells;

a page buffer circuit connected to the memory cell array and including a first page buffer group, a second page buffer group, a third page buffer group, and a fourth page buffer group, each of the first to fourth page buffer groups including a plurality of page buffer units arranged in a matrix form, and a plurality of page buffer units in a first stage of each of the first to fourth page buffer groups being divided into a first group and a second group;

a first page buffer decoder configured to generate a first current corresponding to a number of memory cells included in a first threshold voltage region from first groups of the first and second page buffer groups, and generate a second current corresponding to a number of memory cells included in a second threshold voltage region from second groups of the first and second page buffer groups;

a second page buffer decoder configured to generate a third current corresponding to a number of memory cells included in the first threshold voltage region from first groups of the third and fourth page buffer groups, and generate a fourth current corresponding to a number of memory cells included in the second threshold voltage region from second groups of the third and fourth page buffer groups;

a first mass bit counter configured to generate a first digital output signal from the first current;

a second mass bit counter configured to generate a second digital output signal from the second current;

a third mass bit counter configured to generate a third digital output signal from the third current; and a fourth mass bit counter configured to generate a fourth digital output signal from the fourth current.

10. The memory device of claim 9, wherein:

each first group is configured to perform a first sensing operation according to a first sensing signal, each second group is configured to perform a second sensing operation according to a second sensing signal, and the first sensing signal is enabled at a first time point, and the second sensing signal is enabled at a second time point different from the first time point.

11. The memory device of claim 10, wherein:

each first group includes first page buffer units, and each second group includes second page buffer units, each first page buffers includes a first sensing latch configured to set in response to a first set signal of the first sensing signal, and each second page buffer unit includes a second sensing latch configured to set in response to a second set signal of the second sensing signal.

12. The memory device of claim 10, wherein:

each first group includes first page buffer units, and each second group includes second page buffer units, each first page buffer unit includes a first sensing latch configured to reset in response to a first reset signal of the first sensing signal, and each second page buffer unit includes a second sensing latch configured to reset in response to a second reset signal of the second sensing signal.

13. The memory device of claim 9, wherein:

the first page buffer decoder is adjacent to the first and second page buffer groups in a first horizontal direction, the second page buffer decoder is adjacent to the third and fourth page buffer groups in the first horizontal direction, the first page buffer decoder and the second page buffer decoder are adjacent to each other in a second horizontal direction, and the first to fourth page buffer groups are adjacent to each other in the second horizontal direction.

14. The memory device of claim 13, wherein:

a first wired OR output line, corresponding to the first groups of the first and second page buffer groups, and a second wired OR output line, corresponding to the second groups of the first and second page buffer groups, are above the first page buffer decoder in a vertical direction, and extend in the second horizontal direction, and a third wired OR output line, corresponding to the first groups of the third and fourth page buffer groups, and a fourth wired OR output line, corresponding to the second groups of the third and fourth page buffer groups, are above the second page buffer decoder in the vertical direction, and extend in the second horizontal direction.

15. The memory device of claim 14, wherein:

a fifth wired OR output line, connected to the first wired OR output line, extends in the first horizontal direction, and connects the first page buffer decoder to the first mass bit counter, a sixth wired OR output line, connected to the second wired OR output line, extends in the first horizontal direction, and connects the first page buffer decoder to the second mass bit counter, a seventh wired OR output line, connected to the third wired OR output line, extends in the first horizontal direction, and connects the second page buffer decoder to the third mass bit counter, and an eighth wired OR output line, connected to the fourth wired OR output line, extends in the first horizontal direction, and connects the second page buffer decoder to the fourth mass bit counter.

16. The memory device of claim 9, further comprising:

a control circuitry configured to receive the first to fourth digital output signal from the first to fourth mass bit counters, and perform a valley search operation on a threshold voltage distribution of the memory cells.

17. An operating method of a memory device including first page buffer columns and second page buffer columns, each of the first page buffer columns and the second page buffer columns includes page buffer units arranged in a multi-stage structure, the method comprising:

receiving a read command from a memory controller;

performing a first sensing operation by first page buffer units in a first stage of the first page buffer columns during a first sensing period, and performing a second sensing operation by second page buffer units in the first stage of the second page buffer columns during a second sensing period;

performing a first counting operation counting a first number of memory cells included in a first threshold voltage region from a result of the first sensing operation and a second counting operation counting a second number of memory cells included in a second threshold voltage region from a result of the second sensing operation; and comparing the first number of memory cells and the second number of memory cells in order to search for a valley of a threshold voltage distribution, wherein a start time point of the first sensing period is different from a start time point of the second sensing period, and wherein the first counting operation and the second counting operation are performed at the same time.

18. The operating method of claim 17, wherein the first sensing period partially overlaps the second sensing period.

19. The operating method of claim 17, further comprising:

developing sensing nodes of the first page buffer units during a first development time period before the first sensing period; and developing sensing nodes of the second page buffer units during a second development time period before the second sensing period, wherein the first development time period is different from the second development time period.

20. The operating method of claim 17, wherein:

the first sensing period is from an enable time point of a first reset signal to an enable time point of a first set signal, the second sensing period is from an enable time point of a second reset signal to an enable time point of a second set signal, the first reset signal and the first set signal are sequentially applied to sensing latches of the first page buffer units, and the second reset signal and the second set signal are sequentially applied to sensing latches of the second page buffer units.

* * * * *